(12) United States Patent
Shimizu et al.

(10) Patent No.: US 6,577,073 B2
(45) Date of Patent: Jun. 10, 2003

(54) LED LAMP

(75) Inventors: Masanori Shimizu, Kyoto (JP); Yoko Shimomura, Nara (JP); Tetsushi Tamura, Osaka (JP); Hideo Nagai, Osaka (JP); Nobuyuki Matsui, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/865,874

(22) Filed: May 25, 2001

(65) Prior Publication Data

US 2002/0070681 A1 Jun. 13, 2002

(30) Foreign Application Priority Data

May 31, 2000 (JP) ........................... 2000-161771

(51) Int. Cl.[7] .............. H05B 41/16; F21S 4/00; H01L 29/20
(52) U.S. Cl. .................. 315/246; 362/800; 257/89
(58) Field of Search .................. 313/498, 502, 313/503; 362/800; 257/88, 89, 200, 201; 315/502, 503, 246

(56) References Cited

U.S. PATENT DOCUMENTS

| | | | | |
|---|---|---|---|---|
| 5,813,752 A | * | 9/1998 | Singer et al. | 362/293 |
| 5,952,681 A | * | 9/1999 | Chen | 257/89 |
| 5,962,971 A | * | 10/1999 | Chen | 313/512 |
| 5,966,393 A | * | 10/1999 | Hide et al. | 372/23 |
| 6,144,352 A | * | 11/2000 | Matsuda et al. | 345/83 |
| 6,155,699 A | * | 12/2000 | Miller et al. | 362/293 |
| 6,157,126 A | * | 12/2000 | Yano et al. | 313/485 |
| 6,163,038 A | * | 12/2000 | Chen et al. | 257/103 |
| 6,252,254 B1 | * | 6/2001 | Soules et al. | 257/89 |
| 6,255,670 B1 | * | 7/2001 | Srivastava et al. | 257/89 |
| 6,294,800 B1 | * | 9/2001 | Duggal et al. | 257/89 |
| 6,325,505 B1 | * | 12/2001 | Walker | 347/105 |
| 6,337,536 B1 | * | 1/2002 | Matsubara et al. | 313/498 |
| 6,357,889 B1 | * | 3/2002 | Duggal et al. | 362/84 |

FOREIGN PATENT DOCUMENTS

| | | |
|---|---|---|
| EP | 0 936 682 A1 | 8/1999 |
| EP | 1 017 111 A2 | 7/2000 |
| EP | 1 017 112 A2 | 7/2000 |
| EP | 1 045 458 A2 | 10/2000 |
| JP | 10242513 A | 9/1998 |
| TW | 385063 | 3/2000 |

\* cited by examiner

*Primary Examiner*—Don Wong
*Assistant Examiner*—Minh D A
(74) *Attorney, Agent, or Firm*—Harness, Dickey & Pierce, P.L.C.

(57) ABSTRACT

An LED lamp includes blue and red LEDs and a phosphor. The blue LED produces an emission at a wavelength falling within a blue wavelength range. The red LED produces an emission at a wavelength falling within a red wavelength range. The phosphor is photoexcited by the emission of the blue LED to exhibit a luminescence having an emission spectrum in an intermediate wavelength range between the blue and red wavelength ranges.

23 Claims, 19 Drawing Sheets spectral distribution

LED LAMP

BACKGROUND OF THE INVENTION

The present invention relates to a light-emitting diode (LED) lamp and more particularly relates to an LED white light source.

An LED is a semiconductor device that can produce an emission in a brilliant color highly efficiently in spite of its very small size. And the emission produced by an LED has an excellent monochromatic peak. To produce white light by diffusing and combining the emissions of multiple LEDs, a color mixing process is needed. For example, three LEDs, each producing an emission at a wavelength in the red, green or blue range of the visible spectrum (which will be herein called red, green and blue LEDs, respectively), should be placed closely to each other. However, each of these LEDs has an excellent monochromatic peak. Accordingly, the white light produced by mixing these colors with each other is often uneven. That is to say, where the emissions in the three primary colors cannot be combined together in a desired manner, the resultant white light will be uneven. To eliminate this problem of color unevenness, a technique of producing white light by using a blue LED and a yellow emitting phosphor in combination was developed as disclosed in Japanese Laid-Open Publication No. 10-242513, for example.

According to the technique disclosed in this publication, white light is produced by combining the emission produced by the blue LED with the luminescence that is exhibited by the yellow emitting phosphor when photoexcited by the emission of the blue LED. In this case, white light is obtained using only one LED. Accordingly, the problem of color unevenness, typically observed where multiple different types of LEDs closely disposed are used to produce white light, is avoidable.

In the prior art, LEDs have been mainly applied to display devices. For that reason, the use of multiple LEDs in combination as a white light source (or general illumination lamp) has not yet been researched and developed sufficiently. Where LEDs are used for a display device, just the light emitted spontaneously from the LEDs should have its properties optimized. However, where LEDs are used in combination as a lamp, the white light, with which an object will be illuminated, should have its color rendering performance adjusted as well. And in the current state of the art, no one has ever succeeded in developing an LED lamp with optimized color rendering performance.

It is true that the LED disclosed in the above-identified publication can contribute to producing white light. However, we found that the following problems arise where the LED and yellow emitting phosphor are used in combination as an LED lamp. Specifically, the known LED lamp produces white light by utilizing the emission of the blue LED and the luminescence of the yellow emitting phosphor. Thus, the spectral distribution of the light produced by the LED lamp lacks the emission spectrum for red spectral components covering a wavelength range of 600 nm or more. In that case, if the blue LED with the phosphor is used as an illuminator or backlight, the red spectral components of the object illuminated cannot be reproduced sufficiently. In addition, since the white light is short of the red spectral components, it is difficult to make an LED white light source with a relatively low correlated color temperature. We found it hard for the known white light LED lamp to have a general color rendering index Ra exceeding about 85 even where the light produced by the lamp has such a color as requiring relatively high correlated color temperature (i.e., even if the white light may short of red spectral components). If the white light is appraised by a special color rendering index R9, indicating how brilliant the color red illuminated by the light source look to the human eye, then the red color reproducibility of the white light is obviously poor, e.g., the special color rendering index R9 is as low as about 50.

To compensate for lack of the red emission spectrum covering the wavelength range of 600 nm or more, we also modeled a modified LED lamp that further included a red emitting phosphor in addition to the blue LED and yellow emitting phosphor as disclosed in the publication identified above. However, such a lamp results in very low energy conversion efficiency, because the red spectral components are made up for by getting the red emitting phosphor photoexcited by the emission of the blue LED. That is to say, producing a red emission with the blue emission means a long conversion wavelength, thus considerably decreasing the energy conversion efficiency in accordance with the Stokes' law. As a result, the LED lamp will have its luminous efficacy decreased too much. Thus, it is not practical to add a red emitting phosphor to the blue LED and yellow emitting phosphor.

SUMMARY OF THE INVENTION

It is therefore an object of the present invention to provide an LED lamp with good color reproducibility and high luminous efficacy.

An LED lamp according to the present invention includes blue and red LEDs and a phosphor. The blue LED produces an emission at a wavelength falling within a blue wavelength range. The red LED produces an emission at a wavelength falling within a red wavelength range. The phosphor is photoexcited by the emission of the blue LED to exhibit a luminescence having an emission spectrum in an intermediate wavelength range between the blue and red wavelength ranges.

In one embodiment of the present invention, the red LED may produce the emission at a peak wavelength of 600 nm or more.

In another embodiment of the present invention, the blue LED may produce the emission at a peak wavelength of between 450 and 470 nm. The red LED may produce the emission at a peak wavelength of between 610 and 630 nm. And the phosphor may exhibit the luminescence at a peak wavelength of between 520 and 560 nm.

In still another embodiment, if the LED lamp has a correlated color temperature of 5000 K or more and if color rendering performance of the lamp is appraised using a reconstituted daylight source as a standard source, the blue LED may produce the emission at a peak wavelength of between 450 and 460 nm, the red LED may produces the emission at a peak wavelength of 600 nm or more and the phosphor may exhibit the luminescence at a peak wavelength of between 520 and 560 nm.

In an alternative embodiment, if the LED lamp has a correlated color temperature of less than 5000 K and if color rendering performance of the lamp is appraised using a black-body source as a standard source, the red LED may produce the emission at a peak wavelength of between 615 and 650 nm and the phosphor may exhibit the luminescence at a peak wavelength of between 545 and 560 nm.

In yet another embodiment, the inventive LED lamp may further include means for controlling an intensity of the emission produced by the red LED.

In this particular embodiment, the control means may be a variable resistor.

More specifically, the blue LED preferably produces the emission at a peak wavelength of between 455 and 465 nm, the red LED preferably produces the emission at a peak wavelength of between 620 and 630 nm, and the phosphor preferably exhibits the luminescence at a peak wavelength of between 540 and 550 nm.

In yet another embodiment, the phosphor may be a yellow emitting phosphor that exhibits a yellow luminescence when photoexcited by the emission of the blue LED.

In that case, the yellow emitting phosphor is preferably either a YAG phosphor or a phosphor doped with Mn as a luminescence center.

In an alternative embodiment, the phosphor may be a green emitting phosphor that exhibits a green luminescence when photoexcited by the emission of the blue LED.

Then, the green emitting phosphor is preferably either a YAG phosphor or a phosphor doped with at least one element selected from the group consisting of Tb, Ce, Eu and Mn as a luminescence center.

In yet another embodiment, the blue and red LEDs and the phosphor may be integrated together within a single envelope.

In that case, a site at which the blue LED produces the emission thereof and a site at which the red LED produces the emission thereof may be both located in a single chip.

In yet another embodiment, an LED light source, which includes the blue LED and the phosphor, and another LED light source, including the red LED, may be separately disposed to make a cluster.

An inventive lamp unit includes: at least one LED lamp according to the present invention; and a power supply for supplying power to the lamp.

In one embodiment of the present invention, the lamp unit may further include a reflector for reflecting light produced from the lamp(s).

An LED lamp according to the present invention includes a red LED and can compensate for lack of the red emission spectrum covering a wavelength range of 600 nm or more without decreasing the luminous efficacy of the lamp. Thus, the present invention provides an LED lamp that can produce white light with good color reproducibility and high luminous efficacy.

Also, where the peak wavelengths of the blue and red LEDs and phosphor are between 450 and 470 nm, between 610 and 630 nm, and between 520 and 560 nm, respectively, an LED lamp with good color reproducibility is realized. Furthermore, where the inventive LED lamp additionally includes means for controlling the luminous intensity of the red LED, the luminous intensity of the red LED is easily controllable. Accordingly, the inventive LED lamp can arbitrarily change the color of the light produced.

DESCRIPTION OF THE PREFERRED EMBODIMENTS

Figure 1:
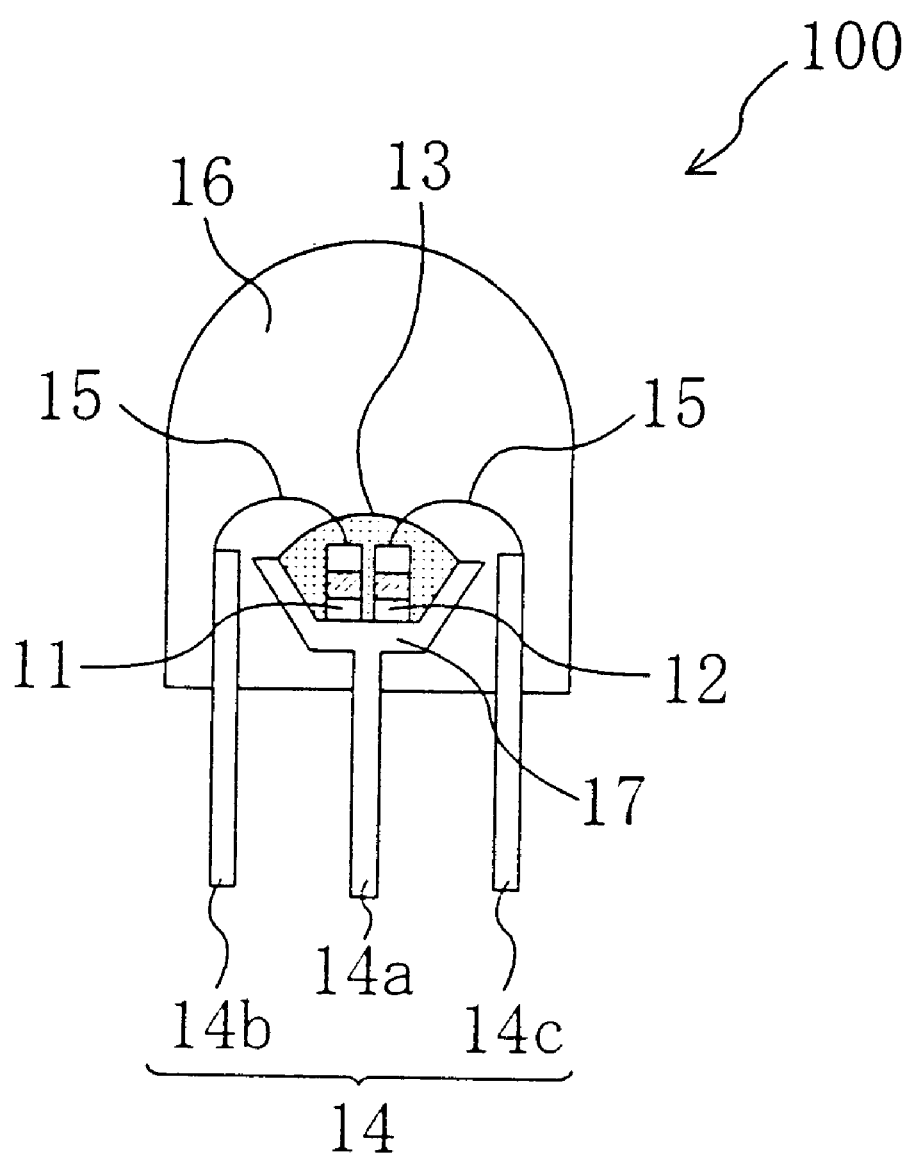
FIG. 1 schematically illustrates a structure for an LED lamp according to a first embodiment of the present invention.

Hereinafter, preferred embodiments of the present invention will be described with reference to the accompanying drawings, in which each member with substantially the same function will be identified by the same reference numeral for the sake of simplicity of description.

Embodiment 1

FIG. 1 schematically illustrates a structure for an LED lamp 100 according to a first embodiment of the present invention. As shown in FIG. 1, the lamp 100 includes blue LED chip 11, red LED chip 12 and phosphor 13, which is photoexcited by the emission of the blue LED chip 11 to exhibit a luminescence.

The blue LED chip 11 may be a GaN-based blue LED chip, for example. The red LED chip 12 may be an AlInGaP-, GaAsP- or GaAlAs-based red LED chip, for example. In the illustrated embodiment, the GaN-based blue LED chip is a blue LED bare chip including a light-emitting layer made of a GaN compound, while the red LED chip is a red LED bare chip including a light-emitting layer made of an AlInGaP, GaAsP or GaAlAs compound. In any case, each light-emitting layer made of any of these compounds is the site at which the associated LED produces its emission.

The phosphor 13 exhibits a luminescence having an emission spectrum in an intermediate range between the blue and red wavelength ranges of the blue and red LED chips 11 and 12. The phosphor 13 is photoexcited by the emission of the blue LED chip 11 to exhibit a luminescence in any color between green and yellow. Preferably, the phosphor 13 is either yellow or green emitting phosphor. It should be noted that the luminescence exhibited by the phosphor 13 may naturally be fluorescence but also be phosphorescence as well.

Figure 2:
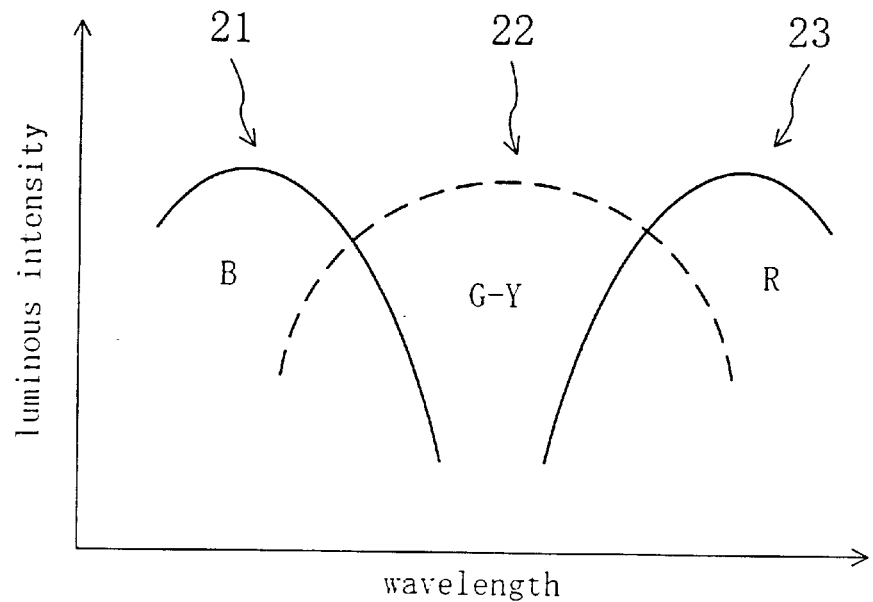
FIG. 2 is a graph illustrating a schematic spectral distribution of the LED lamp shown in FIG. 1.

FIG. 2 schematically illustrates a spectral distribution of the light produced by the LED lamp 100. In FIG. 2, the abscissa indicates the wavelength, while the ordinate indicates the luminous intensity. As shown in FIG. 2, the spectral distribution of the LED 100 includes blue (B) and red (R) emission spectra 21 and 23 and emission (G-Y) spectrum 22 in any color between green and orange (e.g., yellow). The B spectrum 21 represents the emission of the blue LED chip 11. The G-Y spectrum 22 represents the luminescence that is exhibited by the phosphor 13 when photoexcited by the emission of the blue LED chip 11. And the R spectrum 23 represents the emission of the red LED chip 12.

As shown in FIG. 2, the spectral distribution of the LED lamp 100 includes the emission spectrum 23 of red spectral components in addition to the emission spectra 21 and 22. Accordingly, the lamp 100 can produce desired white light because the red emission spectrum covering the wavelength range of 600 nm or more, which the white light produced by the known LED lamp has been short of, is supplemented. The red emission with the spectrum 23 is not the luminescence exhibited by a red emitting phosphor when photoexcited by the emission of the blue LED 11, but is produced from the red LED chip 12 itself. Accordingly, the lamp 100 does not have its luminous efficacy decreased. As described above, where red emission should be produced using the emission of the blue LED chip 11, the lamp will have its luminous efficacy decreased considerably in accordance with the Stokes' law because the blue emission must be converted into the red emission at a very long wavelength. In contrast, the lamp 100 can get the red emission with the spectrum 23 produced directly from the red LED chip 12. Thus, the lamp 100 can produce white light with good color reproducibility while compensating for lack of the red spectral components and without decreasing the luminous efficacy thereof.

Also, where the emissions with the spectra 21, 22 and 23 shown in FIG. 2 should get produced directly from three LED chips, the resultant white light will be uneven in colors. This is because it is difficult to diffuse and mix the respective colored emissions with outstanding monochromatic peaks in such a manner as to produce the desired white light. In contrast, the LED lamp 100 of this embodiment uses the luminescence, exhibited by the phosphor 13 when photoexcited by the emission of the blue LED 11, to make the intermediate spectrum 22 exist between the spectra 21 and 23 of the blue and red LED chips 11 and 12. For that reason, compared to the situation where the emissions with the spectra 21, 22 and 23 are directly produced from three LED chips, it is much easier to diffuse and mix the colors evenly enough. As a result, it is possible to produce desired white light with the color unevenness much reduced or even substantially eliminated.

The blue and red LED chips 11 and 12 and the phosphor 13 can be characterized by the peak wavelengths of their emission spectra 21, 23 and 22. In the illustrated embodiment, the blue LED chip 11 has a peak wavelength of 500 nm or less, while the red LED chip 12 has a peak wavelength of 600 nm or more. A blue-green LED chip with a peak wavelength of 540 nm or less, for example, may also be used as the blue LED chip 11. Thus, the "blue LED (or blue-light-emitting diode) chip" herein comprises a "blue-green LED (or blue-green-light-emitting diode) chip". Where a blue-green LED chip is used, the phosphor 13 should exhibit a luminescence when photoexcited by the emission of the blue-green LED chip.

Figure 3:
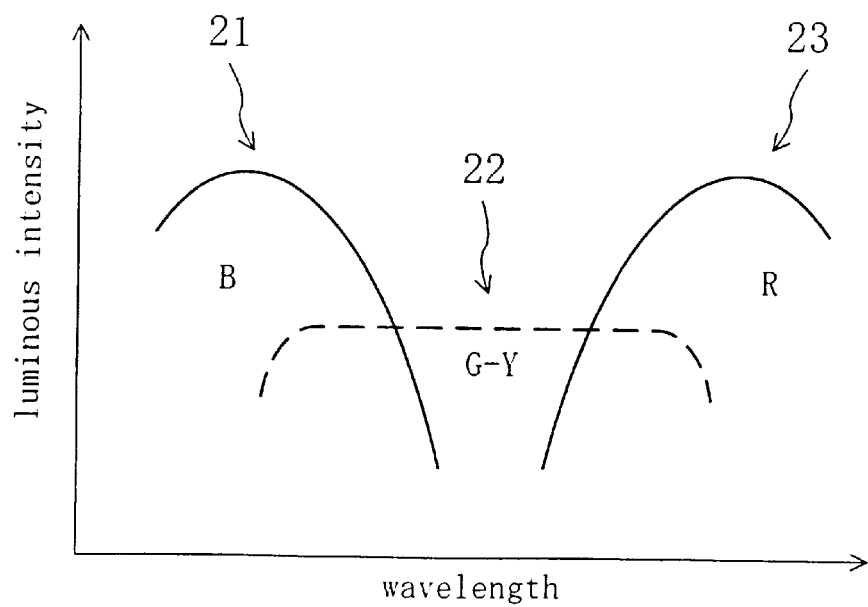
FIG. 3 is a graph illustrating another schematic spectral distribution of the LED lamp shown in FIG. 1.

The phosphor 13 has a peak wavelength falling between the peak wavelengths of the blue and red LED chips 11 and 12. If the phosphor 13 is a yellow emitting phosphor, the phosphor 13 has a peak wavelength preferably between 540 and 590 nm, more preferably between 550 and 590 nm. On the other hand, if the phosphor 13 is a green emitting phosphor, the phosphor 13 has a peak wavelength preferably between 480 and 560 nm, more preferably between 500 and 560 nm.

Where the G-Y spectrum 22 is broadly distributed as shown in FIG. 3, a definite peak of luminescence does not always have to exist between the B and R spectra 21 and 23. In that case, the spectrum 22 of the phosphor 13 may also be characterized by determining a virtual peak wavelength between the B and R spectra 21 and 23. Then, the virtual peak wavelength may be located between (e.g., the midpoint of) the peak wavelengths of the B and R spectra 21 and 23.

Referring back to FIG. 1, the blue and red LED chips 11 and 12 and phosphor 13 are integrated together within a single envelope in the LED white light source (or LED lamp) 100. Specifically, the blue and red LED chips 11 and 12 are placed on a plate-like (or cup-like) pedestal 17, which is an integral part of a leadframe 14. And the phosphor 13 covers the blue and red LED chips 11 and 12 on the pedestal 17. The lamp 100 may be modified in various manners so long as the phosphor 13 can exhibit a luminescence when photoexcited by the emission of the blue LED chip 11. Accordingly, the phosphor 13 may either partially cover the blue and red LED chips 11 and 12 or even not cover the blue or red LED chip 11 or 12 at all.

The lower end (i.e., lower terminal) of the blue LED chip 11 is in contact with the pedestal 17 and is electrically connected to a lead 14a included in the leadframe 14. On the other hand, the upper end (i.e., upper terminal) of the blue LED chip 11 is electrically connected to another lead 14b via a bonding wire 15. The lower end of the red LED chip 12 is also in contact with the pedestal 17 and is electrically connected to the lead 14a. The upper end of the red LED chip 12 is electrically connected to still another lead 14c via another bonding wire 15.

In the illustrated embodiment, the anodes and cathodes of the LED bare chips 11 and 12 are disposed on the upper and lower surfaces of the chips 11 and 12. Alternatively, each LED bare chip may have its anode and cathode formed on the upper or lower surface thereof. Each of these LED bare chips 11 and 12 can be prepared by a known process, e.g., by depositing a light-emitting layer for the LED on a substrate. Also, in the illustrated embodiment, the LED chips 11 and 12 are electrically connected to the leadframe 14 by a wire bonding technique. Alternatively, the LED chips 11 and 12 may also be flip-chip mounted on the leadframe 14. Then, the bonding wires 15 can be omitted.

The leadframe 14 is electrically connected to an external circuit (e.g., lighting circuit) not shown in FIG. 1. When power is supplied to the lamp 100 through the leadframe 14 to energize the blue and red LED chips 11 and 12, the lamp 100 produces white light with its red spectral components supplemented. Also, by regulating the power supplied to the lamp 100 through the leadframe 14, the lamp 100 can have its brightness controlled.

The pedestal 17 on which the blue and red LED chips 11 and 12 are mounted, the bonding wires 15 and parts of the leadframe 14 are molded together with a bulletlike transparent plastic encapsulant 16. The plastic encapsulant 16 may be epoxy or silicone resin, for example. The plastic encapsulant 16 does not have to be formed in the illustrated bullet shape, but may be parallelepiped like a chip for a surface mount device (SMD).

In the integrated LED lamp 100 shown in FIG. 1, the lead 14a is used in common for the blue and red LED chips 11 and 12 and those chips 11 and 12 are mounted on the same pedestal 17. Accordingly, the blue and red LED chips 11 and 12 can be coupled together thermally. Then, it is easier to control the temperature characteristics of the lamp 100 because these chips 11 and 12 can be used at substantially equal temperatures. Otherwise, i.e., if four leads, not including the common lead 14a shown in FIG. 1, were used and if the blue and red LED chips 11 and 12 were mounted on two of the four, it would be necessary to control the temperature characteristics of the blue and red LED chips 11 and 12 independently. This is because the LED chips 11 and 12 are semiconductor devices, and show mutually different temperature dependence during their operations. In contrast, where the blue and red LED chips 11 and 12 are mounted on the same pedestal 17 and coupled together thermally as is done in this embodiment, it is possible to compensate for that difference in operation temperature much more easily. In addition, compared to the realization using four leads, the embodiment shown in FIG. 1 can reduce the number of leads (i.e., extended electrodes) needed, thus cutting down the manufacturing cost of the lamp 100.

The number of leads included in the leadframe 14 is not limited to three as required when one lead 14a is used in common for the LED chips 11 and 12. It is naturally possible to use four leads without using the common lead 14a. Also, if the blue and red LED chips 11 and 12 are electrically connected in series together with a forward current made to flow in the same direction through these chips 11 and 12, the number of leads may be minimized to two.

Furthermore, the LED lamp 100 is an integrated one, and is implementable at a relatively small size. Moreover, the blue and red LED chips 11 and 12 are mounted on the same pedestal 17 and are covered with the phosphor 13. Accordingly, the phosphor 13 can scatter and diffuse the emissions of the blue and red LED chips 11 and 12. For that reason, when an object is illuminated with the light produced by this lamp 100, the color unevenness can be reduced even more effectively. More specifically, where the emissions of the blue and red LED chips 11 and 12 are simply combined to produce white light, the resultant light is not completely white but is uneven in colors to a certain degree. In this LED lamp 100, however, the emissions of these LED chips 11 and 12 are scattered, diffused and then combined while passing through the phosphor 13. As a result, white light with reduced color unevenness can be produced. Optionally, to further scatter and diffuse the emissions and thereby further reduce the color unevenness, the inner surface of the transparent plastic encapsulant 16 may have its surface roughened.

Figure 4:
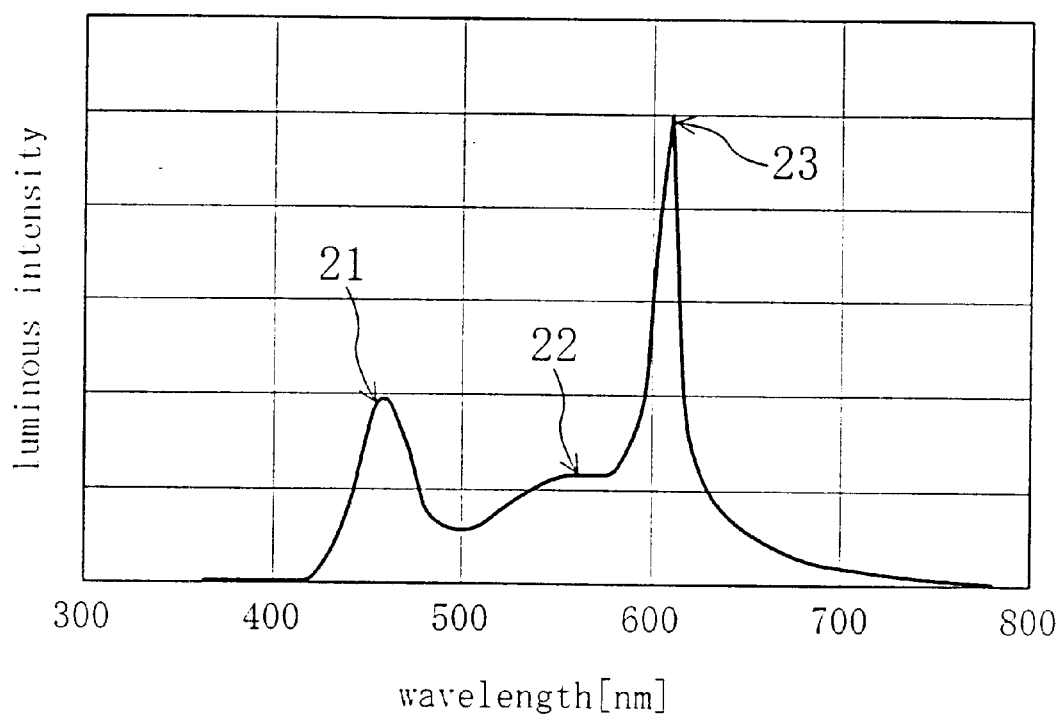
FIG. 4 is a graph illustrating an actual spectral distribution of the LED lamp shown in FIG. 1.
Figure 5A:
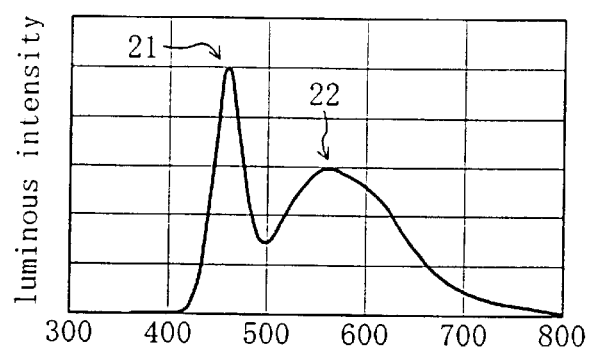
FIGS. 5A through 5D are graphs illustrating various other spectral distributions of the LED lamp shown in FIG. 1.
Figure 5B:
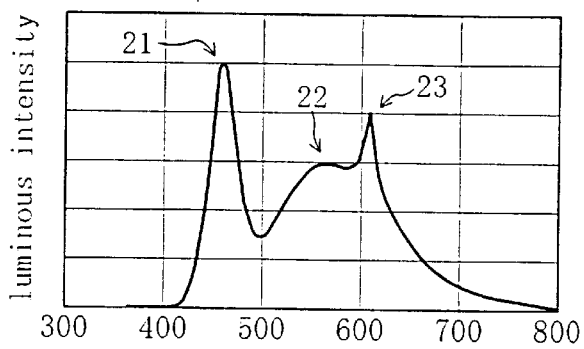
Figure 5C:
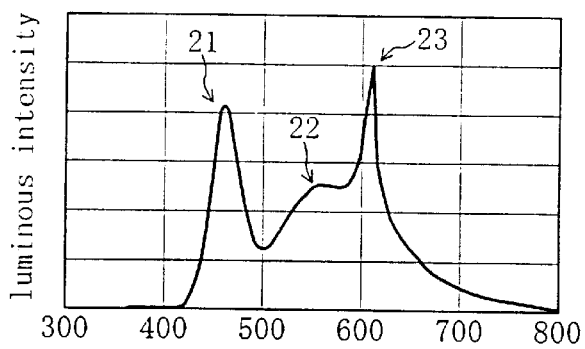
Figure 5D:
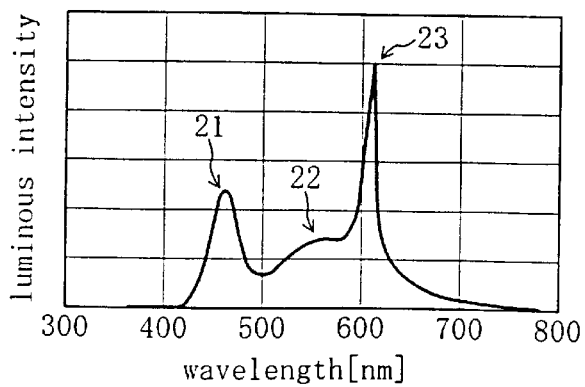

FIG. 4 illustrates an actual spectral distribution of the LED lamp 100. As shown in FIG. 4, the spectral distribution includes not only the emission spectra 21 and 22 of the blue LED chip 11 and yellow emitting phosphor 13 but also the emission spectrum 23 of the red LED chip 12. In the illustrated embodiment, the blue spectrum 21 has a peak wavelength of 460 nm and a peak luminous intensity of about 40. The yellow spectrum 22 has a peak wavelength of 570 nm and a peak luminous intensity of about 20. And the red spectrum 23 has a peak wavelength of 610 nm and a peak luminous intensity of about 100. Accordingly, the LED lamp 100 can supplement the red emission spectrum, which the white light produced by the known method (i.e., photoexciting a yellow emitting phosphor with the emission of a blue LED chip) has been short of.

Also, the red emission spectrum is supplemented by making the red LED chip 12 produce its own emission. For that reason, compared to supplementing a similar red emission spectrum with that of a red emitting phosphor, the LED lamp 100 can show higher luminous efficacy. The red LED chip 12 may have any peak wavelength greater than 580 nm as described above. However, if the red LED chip 12 has a peak wavelength of 600 nm or more, the resultant color reproducibility, which makes the color red reproduced look more brilliant to the human eye, is excellent. This is because the color red reproduced can have an increased excitation purity with respect to the L cones of the visual cells in the human eye (i.e., the visual cells reacting to a stimulus corresponding to the color red) in that case. Accordingly, the peak wavelength of the red LED chip 12 is preferably set to 600 nm or more.

In the current state of the art, none of the phosphors available for LEDs (i.e., red emitting phosphors) can produce a luminescence highly efficiently at a peak wavelength of 600 nm or more. Accordingly, it is very much advantageous to compensate for lack of the red spectral components with those produced by a relatively inexpensive GaAsP- or GaAlAs-based red LED chip 12. It is naturally possible to use an AlInGaP-based LED chip exhibiting higher luminous efficacy although the chip of that type is relatively high-priced. Furthermore, compared to the emission spectrum of a phosphor, the emission spectrum of the red LED chip 12 has a narrower spectral width. Thus, only the red spectral components, which the white light produced by the known LED lamp has been short of, can be supplemented by a simple method.

In addition, the LED lamp 100 of this embodiment can compensate for lack of the red emission spectrum with the emission of the red LED chip 12. Accordingly, the power (i.e., the intensity) of the red emission spectrum is easily controllable electrically. As a result, a light source with variable color temperatures is realized using a simple structure. This is because the luminous intensity of the yellow emitting phosphor 13 is essentially correlated with that of the blue LED chip 11 as its photoexcitation source. Thus, by appropriately controlling the luminous intensities of the blue and red LED chips 11 and 12, the LED lamp 100 can produce light in any arbitrary color.

FIGS. 5A through 5D illustrate various other spectral distributions of the LED lamp 100 where the color of the light produced is variable. As can be seen from FIGS. 5A through 5D, the red emission spectrum 23 increases its peak luminous intensity in the order of FIGS. 5A, 5B, 5C and 5D. That is to say, in the spectral distribution shown in FIG. 5D, the peak intensity of the red emission spectrum 23 is higher than that of any other spectrum shown in FIGS. 5A, 5B or 5C. Also, the higher the peak intensity of the red emission spectrum 23, the lower the correlated color temperature of the LED lamp 100. In other words, by controlling the peak intensity of the red emission spectrum 23, the light produced by the LED lamp 100 can have its color changed arbitrarily. As a result, light in any of various colors having respective correlated color temperatures, e.g., tropical daylight, neutral white, white, warm white or that of an incandescent lamp.

Figure 6:
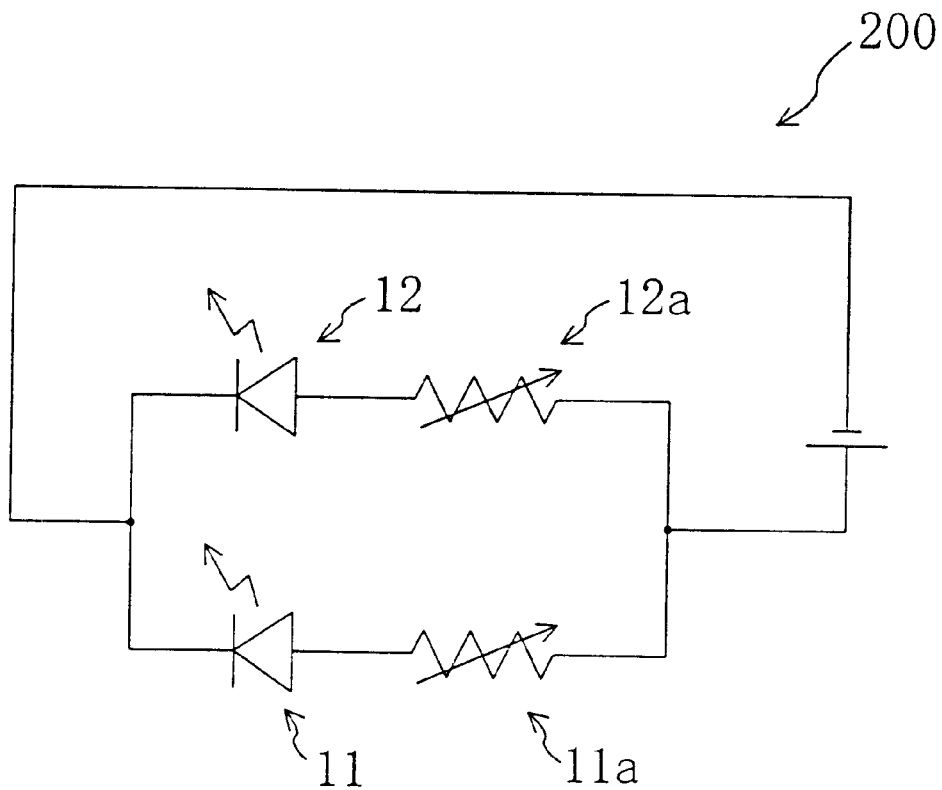
FIG. 6 schematically illustrates a circuit for an LED lamp that can produce light in variable colors.

An LED lamp producing light in variable colors is realized by implementing the LED lamp 100 of this embodiment as a circuit such as that shown in FIG. 6. The circuit 200 shown in FIG. 6 includes the blue and red LED chips 11 and 12 and means 11a and 12a for controlling the luminous intensities of the blue and red LED chips 11 and 12, respectively. In the circuit 200 illustrated in FIG. 6, variable resistors are used as the control means 11a and 12a. The circuit 200 can adjust the luminous intensity ratio of the blue and red LED chips 11 and 12 and can produce light in any desired color. In addition, the circuit 200 can also control the brightness of the lamp easily.

Furthermore, by adjusting the luminous intensity ratio of the blue and red LED chips 11 and 12, the light produced can also have its correlated color temperature changed. Accordingly, the LED lamp still can produce light in various colors even if the control means 11a coupled to the blue LED chip 11 is a fixed resistor and only the control means 12a coupled to the red LED chip 12 is a variable resistor. Alternatively, only the luminous intensity of the blue LED chip 11 may be changed with that of the red LED chip 12 fixed. In the illustrated embodiment, variable resistors are used as the luminous intensity control means 11a and 12a. But the control means 11a and 12a do not have to be the variable resistors. Examples of other applicable intensity control means include: means for switching fixed resistors; means including ladder resistors; frequency control means; means for lighting the lamp at variable frequency division ratios; means for changing the number of LED chips coupled as loads; and means for switching hardwiring methods.

Figure 7:
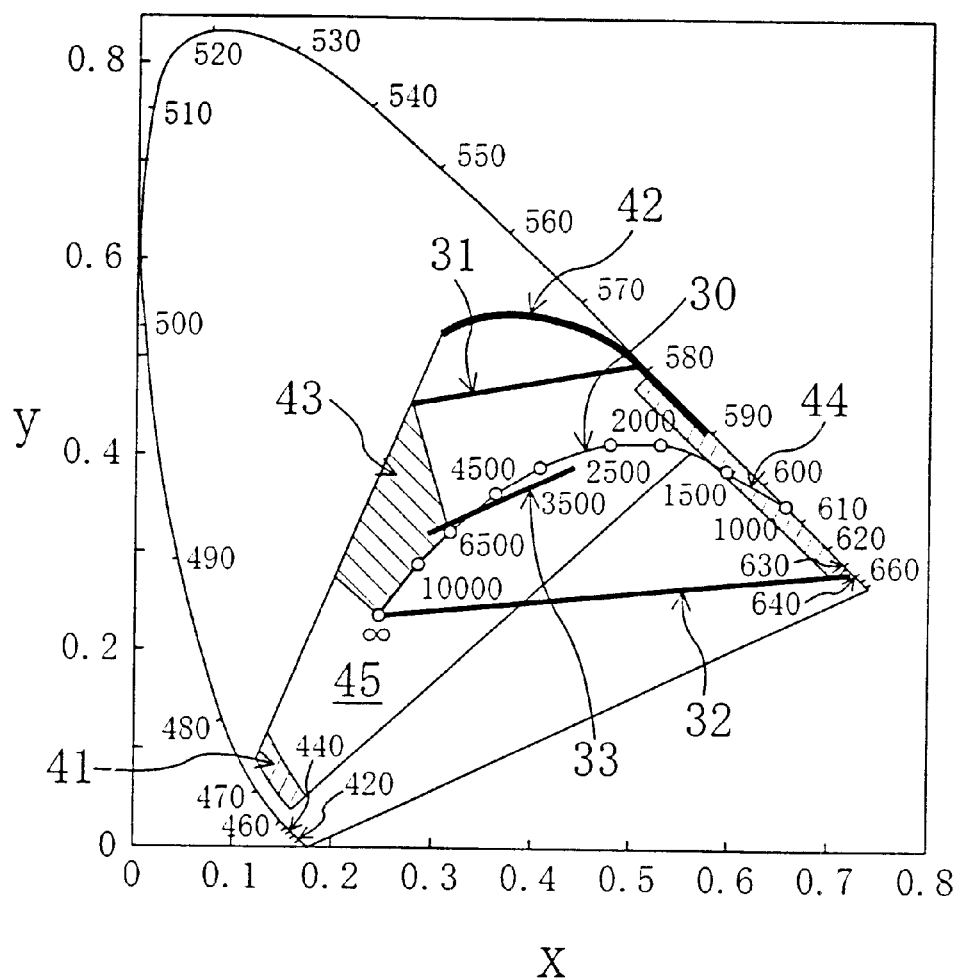
FIG. 7 is a chromaticity diagram of the LED lamp shown in FIG. 1.

FIG. 7 illustrates the chromaticity of the LED lamp 100. Hereinafter, it will be described with reference to FIG. 7 exactly in what range the LED lamp 100 of this embodiment can produce light in variable colors where a yellow emitting phosphor is used as the phosphor 13. The yellow emitting phosphor 13 is either a YAG phosphor or a phosphor doped with Mn as a luminescence center. If the yellow emitting phosphor 13 is a YAG phosphor, the YAG phosphor given by

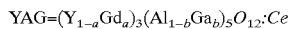

should preferably contain Gd at a smallest possible mole fraction a and Ga at a largest possible mole fraction b to make the luminescence exhibited by the phosphor 13 greener and thereby increase the luminous efficacy.

In FIG. 7, the range 41 represents the chromaticity of the emission produced by the blue LED chip 11, which has a peak wavelength of between about 440 nm and about 480 nm. The curve 42 represents the chromaticity of the luminescence produced by the yellow (YAG) phosphor 13. As described above, the smaller the mole fraction a and the larger the mole fraction b in the composition of the YAG phosphor 13, the greater the coordinate y and the smaller the coordinate x on the chromaticity diagram shown in FIG. 7. The photoexcited luminescence exhibited by the YAG phosphor 13 has a peak wavelength of between about 440 nm to about 480 nm. Accordingly, the YAG phosphor 13 can be photoexcited very efficiently by the emission of the blue LED chip 11 that also falls within the same wavelength range (i.e., the range 41).

The combination of the blue LED chip 11 and yellow (YAG) phosphor 13 theoretically realizes any chromaticity within the range 45 defined by the range 41 and the curve 42. Even in this range 45, however, the closer to the curve 42 the chromaticity of the light produced, the lower the output of the blue LED chip 11 itself as the source of photoexcitation. Accordingly, to get white light produced by the LED lamp efficiently enough, it is actually preferable to define the variable color temperature range as a chromaticity range located between the range 41 and the curve 42 within the range 45. The emission of the red LED chip 12, which will be combined with the white light having a chromaticity falling within such a range, has a chromaticity range 44 corresponding to wavelengths around 600 nm to increase the color rendering performance of the lamp. For that reason, the white light produced by mixing the emission of the blue LED chip 11 with the luminescence of the yellow emitting phosphor 13 preferably has a chromaticity falling within the range 43. As shown in FIG. 7, the range 43 is located over a blackbody radiation locus (i.e., Planckian locus) 30 and has a high correlated color temperature so that the chromaticity of the color-mixed light is not so different from the blackbody radiation locus 30 in a wide correlated color temperature range.

As a result, the LED lamp can have variable correlated color temperatures within a range defined by the chromaticity ranges 43 and 44 of the white light and the emission of the red LED chip 12 (i.e., the range lying between the lines 31 and 32 shown in FIG. 7). In other words, the LED lamp can produce light in any of various colors which has a chromaticity in conformity with the range defined by JIS (Japanese Industrial Standard) or CIE (Commission Internationale d'Eclairage) for fluorescent lamps. Examples of the colors of the light produced include daylight, neutral white, white, warm white or incandescent lamp type color as defined by the JIS standard. According to the CIE standard on the other hand, those colors include daylight, cool white, white and warm white. In addition, the LED lamp can also produce light in any other desired color with a chromaticity falling within an intermediate range between those chromaticity ranges. In FIG. 7, the line 33 represents how broadly the LED lamp 100 of this embodiment can change its chromaticity. As can be seen, the lamp 100 can change its correlated color temperature greatly while maintaining a chromaticity even closer to those represented by the blackbody radiation locus 30.

In the example illustrated in FIG. 7, if the peak wavelength of the red LED chip 12 is set to 630 nm or less, then the locus representing the variation in color of the emission produced therefrom can be substantially matched with the blackbody radiation locus 30. Accordingly, the color of the light produced can have a variable chromaticity, close to those represented by the blackbody radiation locus 30, in a relatively wide correlated color temperature range. As a result, the general color rendering index of the lamp can be increased.

Sometimes the lamp may not have variable correlated color temperatures in a wide range but rather should be used as a low color temperature light source. Then, the range, defined by the chromaticity range 43 of the white light produced by the blue LED chip 11 and the yellow emitting phosphor 13 and the chromaticity range 44 of the red LED chip 12, does not have to lie between the lines 31 and 32. In that case, any appropriate part of the range 45 may be selected instead.

In the foregoing embodiment, a yellow emitting phosphor is used as the phosphor 13. Alternatively, a green emitting phosphor, which exhibits a green luminescence when photoexcited by the emission of the blue LED chip 11, may also be used. The green emitting phosphor exhibits the luminescence at a peak wavelength of between 480 and 560 nm, for example. The green emitting phosphor may be either a YAG phosphor or a phosphor doped with at least one element selected from the group consisting of Tb, Ce, Eu and Mn as a luminescence center. To increase the color rendering performance of the lamp for general illumination purposes, multiple types of phosphors, exhibiting respective luminescences at mutually different peak wavelengths, may also be prepared. None of the LEDs currently available can produce an emission highly efficiently at a wavelength of around 555 nm corresponding to the highest possible luminous efficiency. Accordingly, it is very much significant to supplement an emission spectrum having a peak wavelength approximately equal to this value with the luminescence of an alternative phosphor. Also, in the foregoing embodiment, an inorganic phosphor is used. Instead, an organic phosphor with a comparable peak wavelength may be used as well. This is because as organic electroluminescence (EL) has been developed, industrially applicable organic phosphors have been further researched and developed recently. So under the circumstances such as these, not only inorganic phosphors but also organic phosphors are now almost readily available.

Like the yellow emitting phosphor, the luminous intensity of the green emitting phosphor is also essentially correlated with that of the blue LED chip 11 as its source of photoexcitation. Thus, just by adjusting the luminous intensities of the blue and red LED chips 11 and 12 appropriately, white light in any arbitrary color can be produced. Accordingly, even when the green emitting phosphor is used, an LED illumination lamp for producing white light in various colors is realized using the same simple structure.

No high-efficiency green LEDs with an emission spectrum around the wavelength of 555 nm, corresponding to the highest specific luminous efficiency of the human eye, are currently available at an industrially applicable level. This is why it is very advantageous if an emission in this wavelength range is realizable highly efficiently by the luminescence of a phosphor.

Furthermore, where a green emitting phosphor is used, the respective emission spectra of the blue and red LED chips 11 and 12 and the green emitting phosphor 13 can be concentrated to relatively narrow RGB ranges. Then, a light source with good color reproducibility (i.e., that can reproduce the colors of an object brilliantly enough) and with a large gamut ratio, comparable to a light source that produces emissions in three wavelength ranges, is realized. That is to say, even if this LED lamp including the green emitting phosphor is used as a backlight, the image displayed can have sufficiently high luminance and wide enough gamut area. The peak wavelength of the red LED chip 12 is also preferably 600 nm or more even in this alternative LED lamp. This is because the color red can have its excitation purity to the human eye increased as in the yellow emitting phosphor and even better color reproducibility is attainable.

Where a green emitting phosphor is used, the peak wavelengths of the blue and red LED chips 11 and 12 and the green emitting phosphor are preferably between 440 and 470 nm, between 600 and 650 nm and between 520 and 560 nm, respectively, to increase the color rendering performance of the lamp for general illumination purposes. On the other hand, to increase the color reproducibility when the lamp is used as a backlight, the peak wavelengths of the blue and red LED chips 11 and 12 and the green emitting phosphor are preferably 440 nm or less, 610 nm or more (more preferably 630 nm or more) and between 510 and 550 nm, respectively.

Embodiment 2

A second embodiment of the present invention relates to various preferred combinations of blue and red LED chips 11 and 12 and phosphor 13. As described above, the LED lamp 100 of the first embodiment can supplement the red emission spectrum, which the white light produced by the known LED lamp has been short of, with the emission spectrum of the red LED chip 12. For that reason, the LED lamp 100 excels in color reproducibility. However, to appraise the color reproducibility of this LED lamp 100 more properly, a qualified method of appraisal is needed. Hereinafter, this problem will be described.

It is readily understandable that the LED lamp 100 of the first embodiment will have its special color rendering index R9, indicating how the color red reproduced look to the human eye, and general color rendering index Ra both increased as compared to the known LED white light source. This is because the LED lamp 100 can compensate for lack of the red emission spectrum. However, it is not proper enough to appraise the color reproducibility of the LED lamp just by these indices. That is to say, compared to various conventional light sources for general illumination purposes, including fluorescent lamps, electric lamps and high intensity discharge (HID) lamps, the LED lamp has outstandingly high ability of rendering an illuminated object in very brilliant colors. But this excellent color rendering performance of the LED lamp cannot be appraised properly enough by the known general or special color rendering index only. In other words, those very brilliant colors are unique to LEDs used as a general illumination source, because an LED has a spectral distribution with a narrow half-width and high color purity and without any subemission wavelength.

As shown in FIG. 4, the LED lamp 100 of the first embodiment has a spectral distribution, in which the emission spectra of the blue and red LED chips 11 and 12, corresponding to short and long wavelength ranges of the visible spectrum, each have a narrow spectral half-width. For that reason, compared to a fluorescent lamp, for example, the LED lamp 100 can render colors very much more brilliant. The present inventors succeeded in finding spectral distributions preferred for the LED lamp 100 as a result of intensive research and development. Hereinafter, a method of optimizing the color reproducibility of the LED lamp 100 we adopted will be described first, and then preferred spectral distributions, in which the LED lamp 100 can show excellent color reproducibility, will be exemplified.

First, it will be described what is the problem with the known color appraisal method using color rendering indices. In the known color rendering indexing, each color reproduced on a color chip for color rendering appraisal purposes by a standard source (e.g., reconstituted daylight (CIE daylight source) or blackbody source) with a correlated color temperature equivalent to that of a light source under test is supposed to be 100. Under this supposition, it is appraised and represented as an index how much an associated color reproduced on a color chip by the light source under test is different from the color reproduced on the color chip by the standard source. Accordingly, when the color rendered by the light source under test matches the color rendered by the standard source, the light source under test has the highest score. In accordance with this color appraisal method, if the colors rendered by the light source under test look paler and less impressing than those rendered by the standard source, then the score of the light source under test will naturally be low. However, even if the colors rendered by the light source under test look much more brilliant and impressing than those rendered by the standard source, the score of the light source under test will also be low. That is to say, an unexpected result may be brought about by the known color appraisal method even if the colors rendered by the light source under test look much more brilliant or glaring than those rendered by the standard source.

Generally speaking, we are always surrounded in our daily life with industrial products in artificially created, glowing colors (e.g., brilliant blue or glaring yellow), not just natural objects with an intermediate saturation like woods and stones. Accordingly, where the colors reproduced on the color chip by the light source under test look much more brilliant than those reproduced by the standard source, it is not always proper to give a low score to the light source under test. Thus, to make use of the LED light source even more fully, we optimized the spectral distribution of the LED lamp. Hereinafter, the method of optimization we adopted will be described.

Various international standards already exist for the methods of appraising the color rendering performance of a light source as disclosed in JIS Z8726 in Japan, for example. Although not included in any of these international standards, performance appraisal using a gamut ratio is one of generally admitted and authorized methods of appraising the color rendering performance without using the color rendering indices. According to this method, the color rendering performance of a test source is appraised by the ratio of the gamut area of the test source to that of a standard source. As used herein, the "gamut area" is obtained by plotting and connecting together the chromaticity coordinates of the color rendering indices R1 through R8 of eight test colors for use to calculate a general color rendering index Ra. In this method, the gamut areas of test and standard sources are each obtained by connecting the eight chromaticity coordinates thereof together. Then, the ratio of the gamut area of the test source to that of the standard source is derived as a gamut ratio Ga.

According to this color appraisal method, if Ga is less than 100, then the colors rendered by the test source should look pale because the colors have decreased degrees of saturation. On the other hand, if Ga is greater than 100, then the colors rendered by the test source should look brilliant because cause the colors have increased degrees of saturation. As described above, where the color rendering performance of a given light source is appraised by the difference in color reproduced between the given and standard sources, a low Ra gives an unreasonably low score to the given light source even if colors reproduced by the given light source look brilliant to the human eye. In contrast, according to this area ratio method, a high score can be given properly to the test source that can reproduce colors of an object brilliantly enough even if the Ra thereof is low. So this method seems to be effectively applicable to properly appraising the brilliant colors reproduced by an LED lamp. However, if this performance appraisal method is used by itself, a higher Ga ratio may give a higher score to a light source under test. Nevertheless, when the performance of another light source, reproducing similar but excessively brilliant colors, is appraised by the conventional color rendering indexing, the resultant Ra ratio will be low. Then, that big difference in colors reproduced between the test and standard sources will make an impression of unnatural illumination on the viewer. That is to say, if the Ga ratio alone were used, then the score given as the Ga ratio to the test source might be much different from the score given as the Ra index to the light source.

Thus, we newly used another gamut ratio, obtained by connecting together the chromaticity coordinates of four special color rendering indices R9 through R12 for brilliant red, yellow, green and blue, respectively, as an alternative index representing the color rendering performance. That is to say, just like the known Ga ratio obtained by connecting together the eight chromaticity coordinates for the color rendering indices R1 through R8 as disclosed in JIS Z8726, another gamut ratio is similarly calculated by using R9 through R12 instead of R1 through R8. This alternative gamut ratio will be herein identified by "Ga4".

The color rendering indices R1 through R8 are essentially selected to know the degree of subtle difference between naturally reproduced colors and are associated with eight test colors with intermediate degrees of saturation. In contrast, the special color rendering indices R9 through R12 are essentially selected to know the degree of difference between brilliantly reproduced colors. Accordingly, by using this new Ga4 ratio, it is possible to appraise the color rendering performance of a given light source properly by seeing if an object to be seen in brilliant colors does look glowing. That is to say, if an object illuminated should be seen in subtly different and naturally reproduced colors at intermediate degrees of saturation, then the light source should illuminate the object exactly in its natural colors so that the Ga ratio and Ra index can approach 100. On the other hand, if another object should look brilliantly to the human eye, then the light source should illuminate the object in such a manner that the Ga4 ratio increases. Then, the colors reproduced can be optimized. And by optimizing the colors reproduced this way, any object can be illuminated either in naturally reproduced colors or in sharply contrasted colors at high degrees of saturation.

So the present inventors carried out the optimization processing on the LED lamp 100 of the first embodiment. As a result, we made the following findings:

1. Where the red LED chip 12 has a peak wavelength of 600 nm or more, the general color rendering index Ra of the lamp 100 can be increased. On the other hand, where the red LED chip 12 has a peak wavelength of between 610 and 630 nm, Ra and Ga4 can be both increased and yet Ga4 can be higher than Ga. That is to say, in this wavelength range, colors with intermediate degrees of saturation, which should be reproduced subtly and precisely, can be reproduced naturally, while colors with high degrees of saturation can be reproduced brilliantly.

Where the blue LED chip 11 has a peak wavelength of 470 nm or less, Ra can be increased. On the other hand, where the blue LED chip 11 has a peak wavelength of between 450 and 470 nm, Ra and Ga4 can be both increased and yet Ga4 can be higher than Ga.

The phosphor 13 to be combined with these LED chips preferably has a peak wavelength of between 520 and 560 nm, more preferably between 545 and 560 nm. In the latter range, Ra can be increased more often.

2. If the LED lamp 100 has a correlated color temperature of 5000 K or more and if the color rendering performance thereof is appraised using a reconstituted daylight source as a standard source, then the peak wavelengths of the blue and red LED chips 11 and 12 and phosphor 13 are preferably between 450 and 460 nm, 600 nm or more and between 520 and 560 nm, respectively.

3. If the LED lamp 100 has a correlated color temperature of less than 5000 K and if the color rendering performance thereof is appraised using a blackbody source as a standard source, then the peak wavelengths of the red LED chip 12 and phosphor 13 are preferably between 615 and 650 nm and between 545 and 560 nm, respectively.

4. If the LED lamp 100 has variable correlated color temperatures, then the peak wavelengths of the blue and red LED chips 11 and 12 and phosphor 13 are preferably between 455 and 465 nm, between 620 and 630 nm and between 540 and 550 nm, respectively.

Hereinafter, exemplary LED lamps 100 with optimized color reproducibility will be described with reference to FIGS. 8A through 10C and Tables 1 through 3.

Figure 8A:
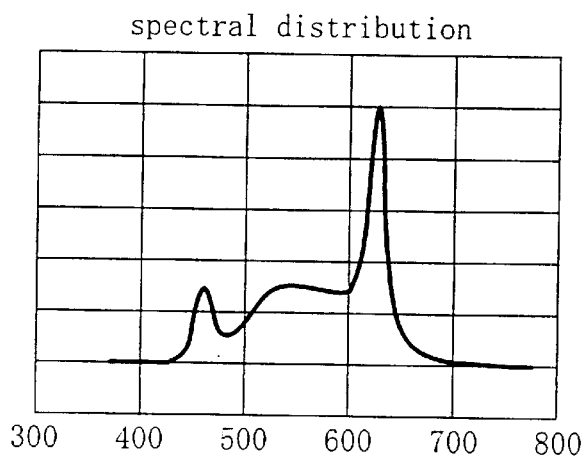
FIG. 8A is a graph illustrating a spectral distribution of the LED lamp shown in FIG. 1 with optimized color reproducibility where the lamp has a correlated color temperature of 3000 K.

FIG. 8A illustrates a spectral distribution of the LED lamp 100 with an optimized color reproducibility where the lamp 100 has a correlated color temperature as low as 3000 K, which is close to the lower limit of correlated color temperatures for an everyday illumination light source. At this correlated color temperature of 3000 K, a blackbody source is used as a standard source for calculating Ra. In this example, the peak wavelengths of the blue and red LED chips 11 and 12 and phosphor 13 are 460, 625 and 545 nm, respectively.

Figure 8B:
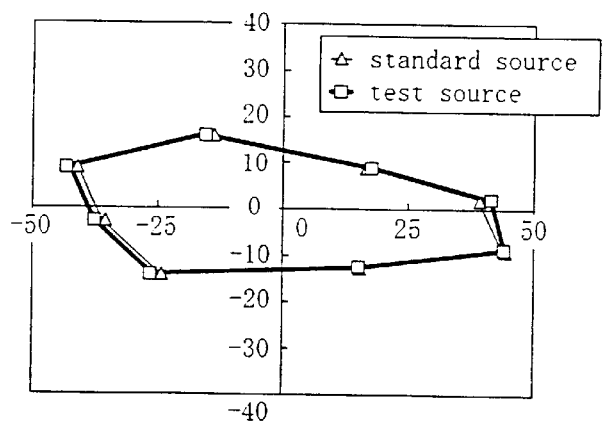
FIGS. 8B and 8C are graphs illustrating its gamut ratios Ga and Ga4, respectively.
Figure 8C:
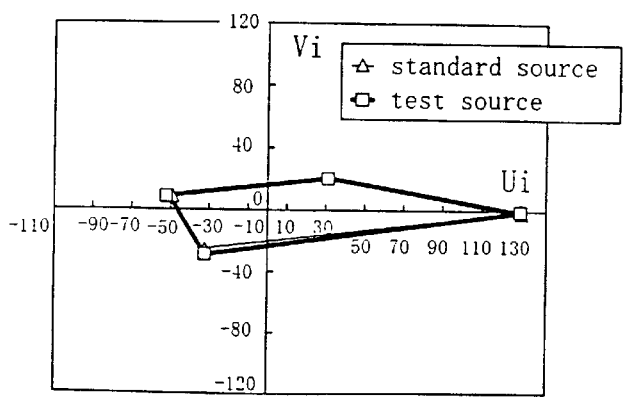

FIGS. 8B and 8C respectively illustrate the gamut ratios Ga and Ga4 of the LED lamp 100 having the spectral distribution shown in FIG. 8A. The following Table 1 shows not only these parameters but also the chromaticity coordinates (x, y), Duv, color rendering indices Ra and R1 through R15 and gamut ratios of the LED lamp 100 shown in FIGS. 8A, 8B and 8C:

TABLE 1

| Peak wavelength of blue LED | 460 nm |
| Peak wavelength of red LED | 625 nm |
| Peak wavelength of phosphor | 545 nm |
| Correlated color temperature Tc | 3000K |
| Duv | 0.02 |
| Chromaticity coordinates (x, y) | (0.43695, 0.40410) |

| Color rendering index | | | |
| --- | --- | --- | --- |
| R1 | 88.2 | R9 | 93.1 |
| R2 | 95.5 | R10 | 97.2 |
| R3 | 93.1 | R11 | 85.9 |
| R4 | 89.6 | R12 | 81.0 |
| R5 | 91.4 | R13 | 89.7 |
| R6 | 88.9 | R14 | 92.9 |
| R7 | 96.6 | R15 | 91.9 |
| R8 | 96.4 | Ra | 92.4 |

| Gamut ratio | |
| --- | --- |
| Ga | 103.3 |
| Ga4 | 109.3 |

Figure 9A:
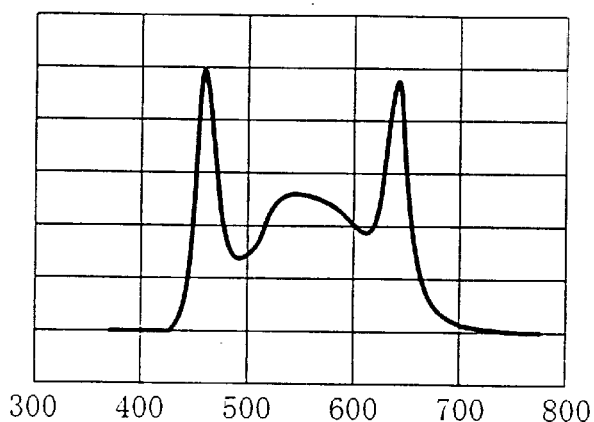
FIG. 9A is a graph illustrating a spectral distribution of the LED lamp shown in FIG. 1 with optimized color reproducibility where the lamp has a correlated color temperature of 5000 K.
Figure 9B:
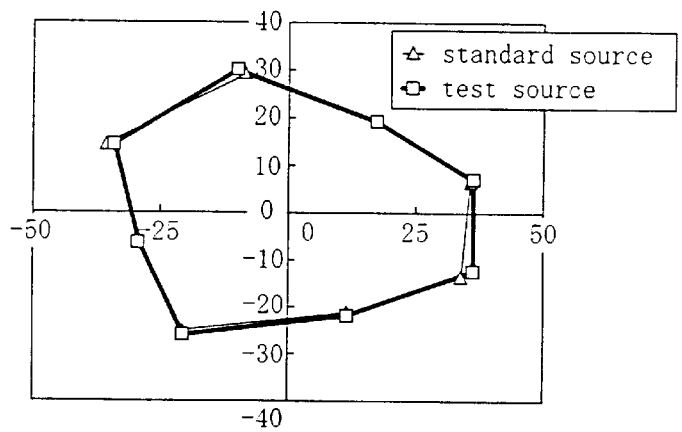
FIGS. 9B and 9C are graphs illustrating its gamut ratios Ga and Ga4, respectively.
Figure 9C:
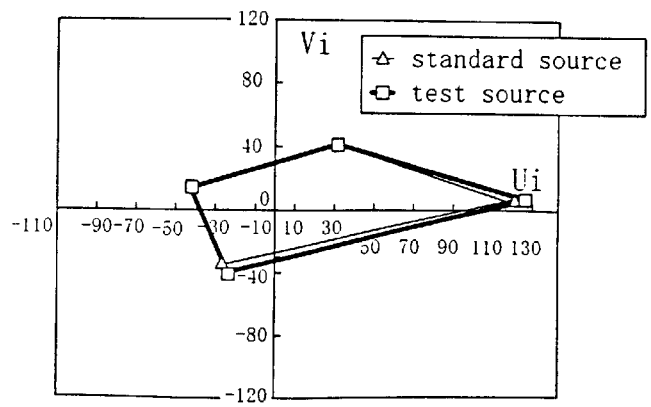

FIG. 9A illustrates a spectral distribution of the LED lamp 100 with optimized color reproducibility where the lamp 100 has an intermediate correlated color temperature of 5000 K. The correlated color temperature of 5000 K is a point at which the standard sources for use to calculate Ra are switched from a blackbody source into a reconstituted daylight source. In this example, the peak wavelengths of the blue and red LED chips 11 and 12 and phosphor 13 are 460, 640 and 545 nm, respectively. FIGS. 9B and 9C respectively illustrate the gamut ratios Ga and Ga4 of the LED lamp 100 having the spectral distribution shown in FIG. 9A. Like Table 1, the following Table 2 shows not only these parameters but also the chromaticity coordinates (x, y), Duv, color rendering indices Ra and R1 through R15 and gamut ratios of the LED lamp 100 shown in FIGS. 9A, 9B and 9C:

TABLE 2

| Peak wavelength of blue LED | 460 nm |
| Peak wavelength of red LED | 640 nm |
| Peak wavelength of phosphor | 545 nm |
| Correlated color temperature Tc | 5000K |
| Duv | −0.01 |
| Chromaticity coordinates (x, y) | (0.34511, 0.35161) |

| Color rendering index | | | |
| --- | --- | --- | --- |
| R1 | 97.3 | R9 | 66.6 |
| R2 | 99.1 | R10 | 94.9 |
| R3 | 92.1 | R11 | 94.4 |
| R4 | 94.4 | R12 | 65.0 |
| R5 | 94.2 | R13 | 98.2 |
| R6 | 93.6 | R14 | 94.5 |
| R7 | 95.8 | R15 | 90.2 |
| R8 | 87.7 | Ra | 94.3 |

| Gamut ratio | |
| --- | --- |
| Ga | 101.6 |
| Ga4 | 112.9 |

Figure 10A:
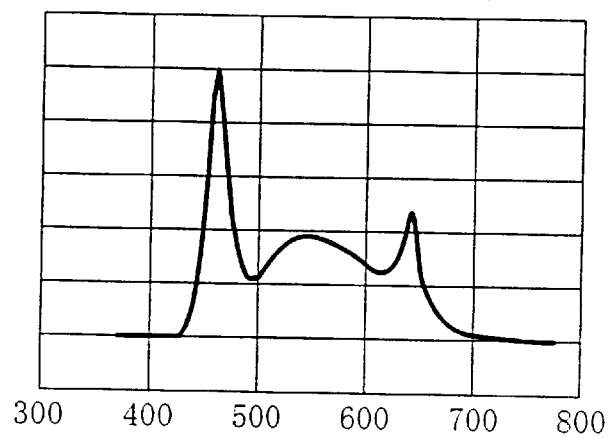
FIG. 10A is a graph illustrating a spectral distribution of the LED lamp shown in FIG. 1 with optimized color reproducibility where the lamp has a correlated color temperature of 6700 K.
Figure 10B:
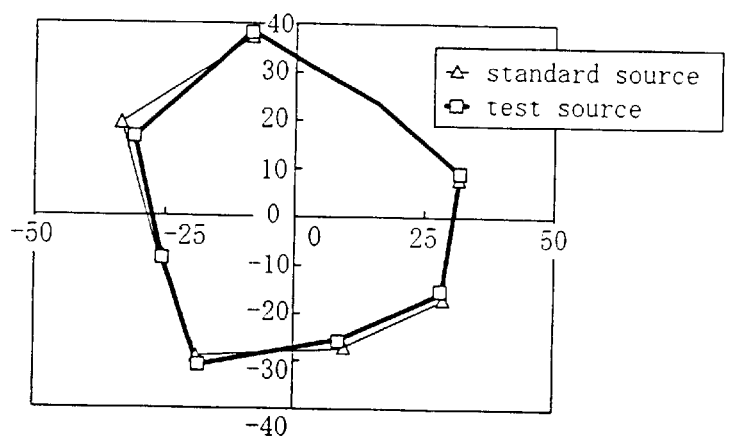
FIGS. 10B and 10C are graphs illustrating its gamut ratios Ga and Ga4, respectively.
Figure 10C:
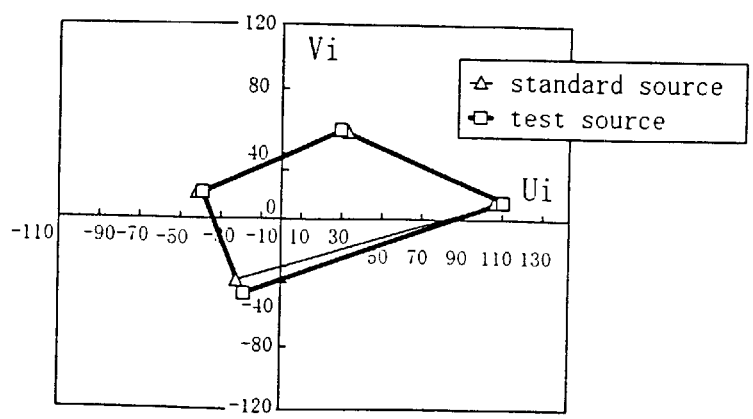

FIG. 10A illustrates a spectral distribution of the LED lamp 100 with optimized color reproducibility where the lamp 100 has a correlated color temperature as high as 6700 K, which is close to the upper limit of correlated color temperatures for an everyday illumination light source. At the correlated color temperature of 6700 K, a reconstituted daylight source is used as a standard source for calculating Ra. In this example, the peak wavelengths of the blue and red LED chips 11 and 12 and phosphor 13 are 460, 640 and 545 nm, respectively. FIGS. 10B and 10C respectively illustrate the gamut ratios Ga and Ga4 of the LED lamp 100 having the spectral distribution shown in FIG. 10A. The following Table 3 shows not only these parameters but also the chromaticity coordinates (x, y), Duv, color rendering indices Ra and R1 through R15 and gamut ratios of the LED lamp 100 shown in FIGS. 10A, 10B and 10C:

TABLE 3

| Peak wavelength of blue LED | 460 nm |
| Peak wavelength of red LED | 640 nm |
| Peak wavelength of phosphor | 545 nm |
| Correlated color temperature Tc | 6700K |
| Duv | 0.02 |
| Chromaticity coordinates (x, y) | (0.31055, 0.32076) |

| Color Rendering index | | | |
| --- | --- | --- | --- |
| R1 | 95.0 | R9 | 92.3 |
| R2 | 98.8 | R10 | 93.9 |
| R3 | 94.9 | R11 | 85.5 |
| R4 | 85.0 | R12 | 57.1 |
| R5 | 88.8 | R13 | 98.9 |
| R6 | 90.8 | R14 | 96.9 |

TABLE 3-continued

| R7 | 91.6 | R15 | 90.4 |
|---|---|---|---|
| R8 | 92.5 | Ra | 92.2 |

| Gamut ratio | |
|---|---|
| Ga | 96.6 |
| Ga4 | 107.5 |

FIGS. 11A through 13C illustrate typical combinations of blue and red LED chips 11 and 12 and phosphor 13 we made to optimize the color reproducibility of the LED lamp 100. In FIGS. 11A through 13C, the ordinate represents the Ra index of the LED lamp 100 while the abscissa represents the peak wavelength (nm) of the red LED chip 12. The Ra index of the LED lamp 100 was obtained as a result of actual measurement or simulation. In FIGS. 11A through 13C, the respective coordinates, indicated by solid circles, triangles and squares, were obtained under the conditions specified in FIGS. 8A through 8C and Table 1.

Figure 11A:
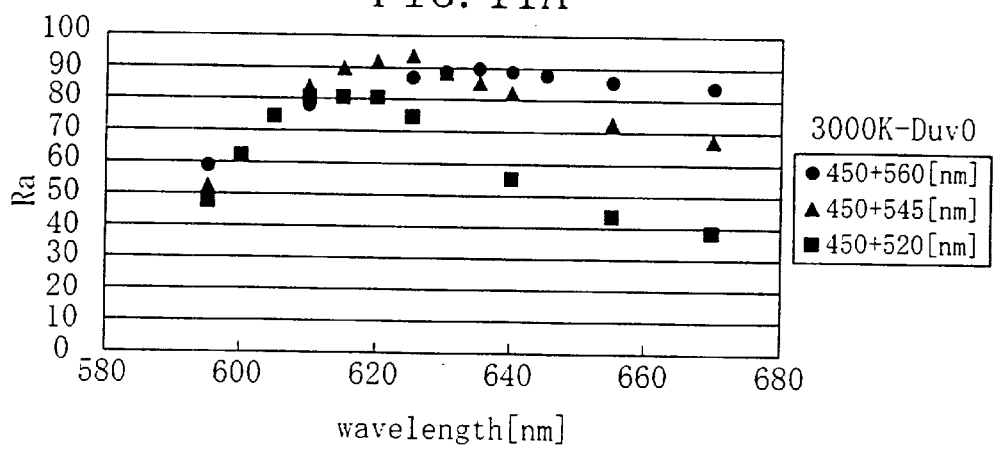
FIGS. 11A through 11C are graphs each illustrating relationships between the peak wavelength (nm) of the red LED chip shown in FIG. 1 and the Ra index.
Figure 11B:
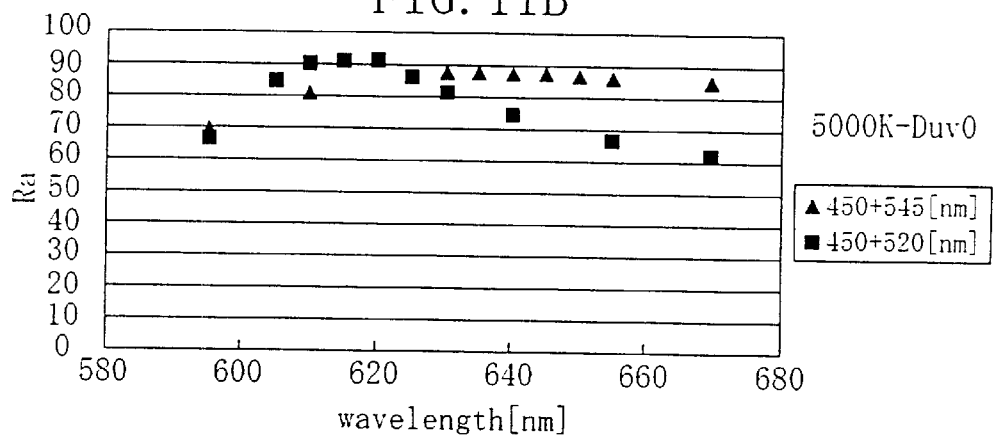
Figure 11C:
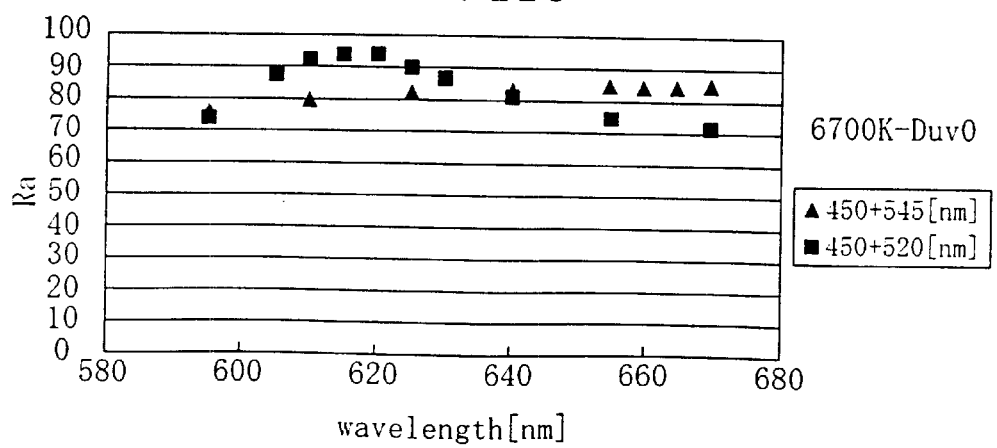

FIGS. 11A, 11B and 11C illustrate examples corresponding to correlated color temperatures of 3000, 5000 and 6700 K, respectively. In these examples, the peak wavelength of the blue LED chip 11 was fixed at 450 nm, while that of the phosphor 13 was changed from 520 nm (belonging to the green wavelength range) to 560 nm (belonging to the yellow wavelength range). The solid circles, triangles and squares correspond to the phosphor's peak wavelengths of 560, 545 and 520 nm, respectively. The peak wavelength of the red LED chip 12 was changed from 595 nm to 670 nm.

Figure 12A:
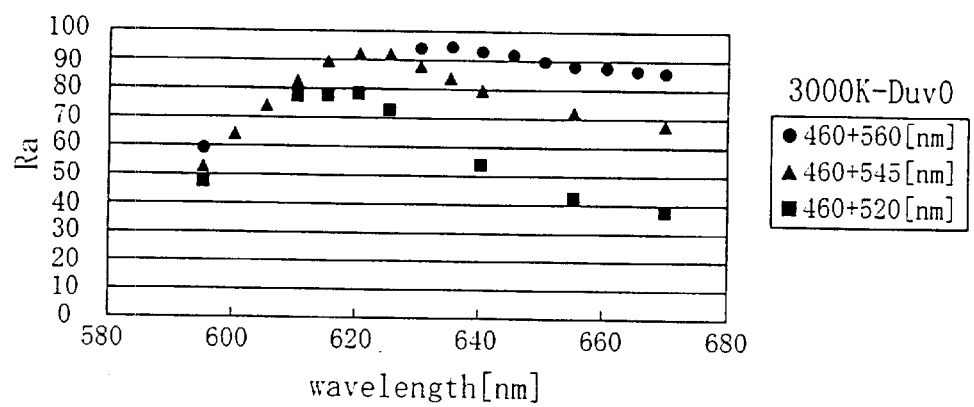
FIGS. 12A through 12C are graphs each illustrating relationships between the peak wavelength (nm) of the red LED chip shown in FIG. 1 and the Ra index.
Figure 12B:
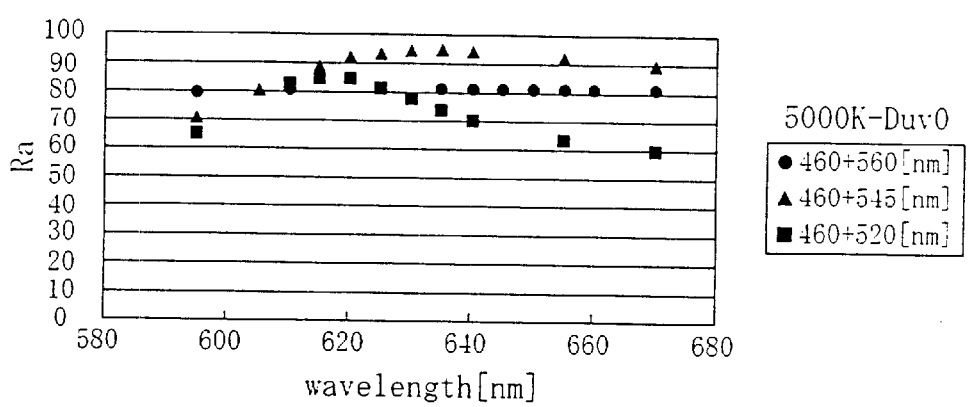
Figure 12C:
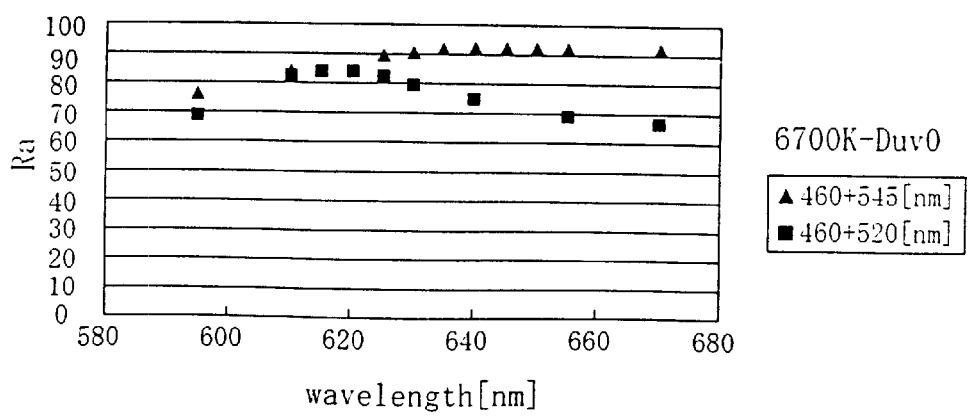
Figure 13A:
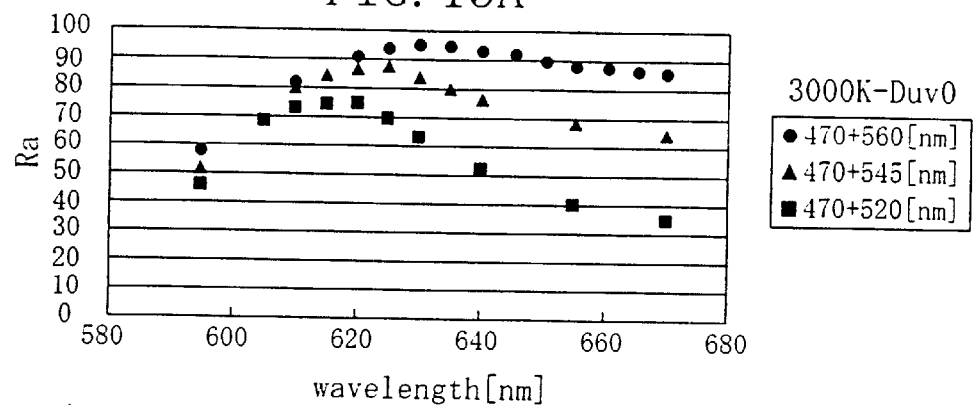
FIGS. 13A through 13C are graphs each illustrating relationships between the peak wavelength (nm) of the red LED chip shown in FIG. 1 and the Ra index.
Figure 13B:
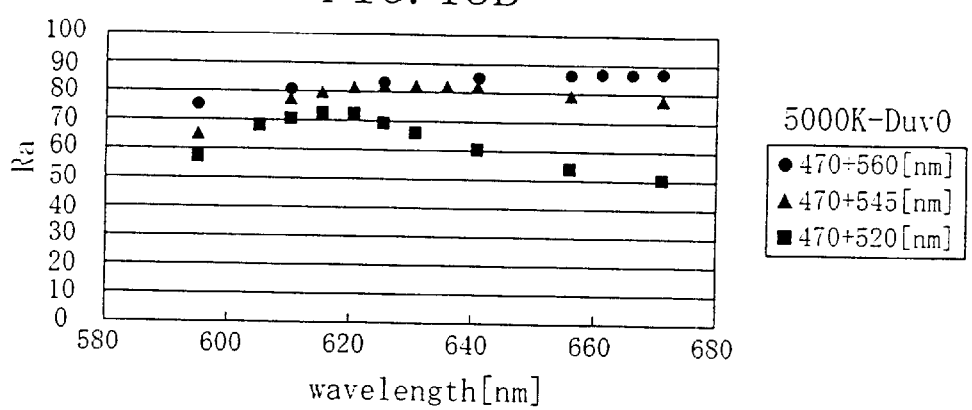
Figure 13C:
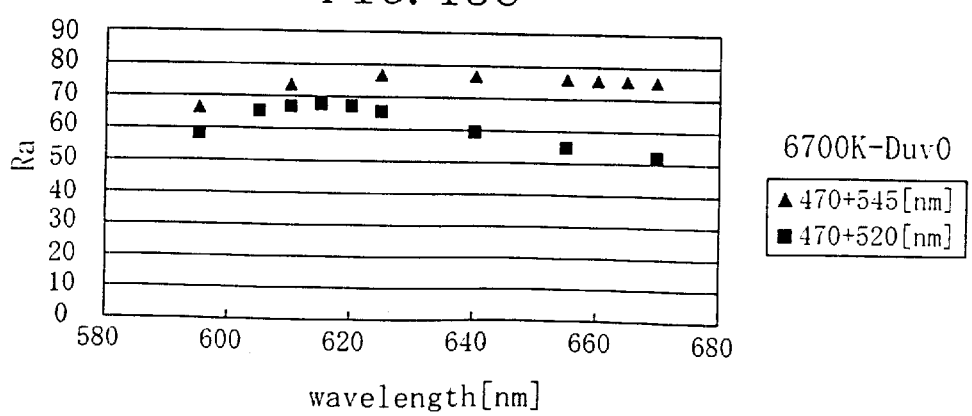

FIGS. 12A, 12B and 12C illustrate examples corresponding to correlated color temperatures of 3000, 5000 and 6700 K, respectively. In these examples, the peak wavelength of the blue LED chip 11 was fixed at 460 nm. FIGS. 13A, 13B and 13C illustrate examples corresponding to correlated color temperatures of 3000, 5000 and 6700 K, respectively. In these examples, the peak wavelength of the blue LED chip 11 was fixed at 470 nm.

Based on the results shown in FIGS. 8A through 13C and Tables 1 through 3, our findings will be further detailed.

The JIS standard defines that a high-color-rendering fluorescent lamp emitting in three wavelength ranges should have an Ra index of 80 or more. In designing the LED lamp 100 with a high Ra index of 80 or more, it can be seen from those results that the Ra index could be increased where the red LED chip 12 had a peak wavelength of 600 nm or more. Then, the LED lamp 100 can have an Ra index as high as 80 or even more. More particularly, a preferred peak wavelength range of the red LED chip 12, in which the Ra index was either sufficiently high or tended to be saturated, was from 610 nm to 630 nm. In such a range, colors with intermediate degrees of saturation, which should be reproduced subtly and precisely, can be reproduced naturally. In addition, the LED lamp 100 has a high-purity spectral distribution in which the blue and red wavelength ranges, corresponding to the short and long wavelength parts of the visible spectrum, each have a narrow spectral half-width. Accordingly, the lamp 100 can reproduce colors with high degrees of saturation brilliantly enough. That is to say, a desired visual environment, which has a sufficiently high Ra index and yet is illuminated in sharply contrasted colors, is realized.

We also found that the Ra index could be increased where the blue LED chip 11 had a peak wavelength of 470 nm or less. This is because where the blue LED chip 11 had a peak wavelength of greater than 470 nm, we found it difficult to realize an LED lamp 100 with a high correlated color temperature or with an Ra index exceeding 80. Also, even though we tried to realize an LED lamp 100 with a relatively low correlated color temperature, if the blue LED chip 11 had a peak wavelength of more than 470 nm, we found the preferred peak wavelength range of the red LED chip 12, in which the Ra index could be high, very narrow. On the other hand, the peak wavelength of the blue LED chip 11 is preferably at least 450 nm. This is because if the peak wavelength of the blue LED chip 11 is less than 450 nm, then the Ra index rarely exceeds 90. In addition, to realize an LED lamp 100 with a relatively high correlated color temperature, the preferred peak wavelength range of the phosphor 13 is very much limited.

Considering the luminous efficacy of the lamp 100, the peak wavelengths of the red and blue LED chips 11 and 12 should be as follows. The peak wavelength of the red LED chip 12 is preferably between 610 and 630 nm, because the luminous efficacy (1 m/W) of the LED lamp 100 would decrease otherwise. On the other hand, the peak wavelength of the blue LED chip 11 is preferably 450 nm or more, because the luminous efficacy (1 m/W) of the LED lamp 100 would also decrease otherwise.

We also found that the phosphor 13 to be combined with one of the LED chips (or the blue LED chip 11, in particular) should preferably have a peak wavelength of between 520 and 560 nm. Considering that the phosphor 13 may be combined with any other LED chip, the peak wavelength of the phosphor 13 is more preferably and more generally between 545 and 560 nm, because a sufficiently high Ra index can be obtained in this range.

We further found the following. To increase the Ra index of an LED lamp 100 with broadly variable correlated color temperatures while using the same LED chips and the same phosphor, keeping the peak wavelengths thereof constant but changing only the intensity ratio thereof, the peak wavelengths of the blue and red LED chips 11 and 12 and phosphor 13 should preferably be between 455 and 465 nm, between 620 and 630 nm and between 540 and 550 nm, respectively.

To realize an LED lamp showing high Ra indices of 90 or more at various correlated color temperatures, not just broadly variable colors reproduced, the following wavelength ranges should be defined. It should be noted that an Ra index as high as 90 or more belongs to color rendering performance group 1A (Ra≧90) according to the CIE classification and is high enough to be applicable to various environments requiring highly precise color rendering performance (e.g., in museums). If a lamp with a relatively high correlated color temperature of 5000 K or more should have its color rendering performance appraised using a reconstituted daylight source as a standard source, then the peak wavelengths of the red and blue LED chips 12 and 11 and phosphor 13 are preferably 600 nm or more, between 450 and 460 nm and between 520 and 545 nm, respectively. On the other hand, if a lamp with a relatively low correlated color temperature should have its color rendering performance appraised using a blackbody source as a standard source, then the peak wavelengths of the red LED chip 12 and phosphor 13 are preferably between 615 and 650 nm and between 545 through 560 nm, respectively.

Most preferred combinations of peak wavelength ranges, in which Ra and Ga are both sufficiently high and yet Ga4 is also high, are as shown in FIGS. 8A through 10C. It should be readily understandable to those skilled in the art that an LED lamp 100 with high Ra index and high Ga and Ga4 ratios is also realizable even if the illustrated peak wavelength ranges are slightly shifted on the order of several nanometers (e.g., about ±5 to 10 nm).

Where the lamp 100 has a relatively low correlated color temperature (e.g., 3000 K), the peak wavelengths of the blue and red LED chips 11 and 12 and phosphor 13 should preferably be 460, 625 and 545 nm, respectively. Then, the LED lamp 100 can have Ra, Ga and Ga4 of 92.4, 103.3 and 109.3, respectively.

Where the lamp 100 has an intermediate correlated color temperature (e.g., 5000 K), the peak wavelengths of the blue and red LED chips 11 and 12 and phosphor 13 should preferably be 460, 640 and 545 nm, respectively. Then, the LED lamp 100 can have Ra, Ga and Ga4 of 94.3, 101.6 and 112.9, respectively.

Where the lamp 100 has a relatively high correlated color temperature (e.g., 6700 K), the peak wavelengths of the blue and red LED chips 11 and 12 and phosphor 13 should preferably be 460, 640 and 545 nm, respectively. Then, the LED lamp 100 can have Ra, Ga and Ga4 of 92.2, 96.6 and 107.5, respectively.

The LED lamp of this embodiment has its color reproducibility optimized by way of the Ga and Ga4 ratios after the respective peak wavelength ranges have been defined to attain a high Ra index. Accordingly, the distribution of respective test colors reproduced by this light source is less deformed and yet those colors look much more brilliant. That is to say, the R9 through R12 indices, used as special color rendering indices for brilliant red, yellow, green and blue, correspond to typical brilliant test colors artificially created. Therefore, if the Ga4 ratio, calculated from these indices for brilliant test colors, is maximized for an LED lamp with high Ra (and Ga), then the light source can reproduce natural colors even more naturally and yet only a few selected brilliant colors even more brilliantly. An object in any of these brilliant colors normally has a spectral reflectance that changes steeply at a particular wavelength. Accordingly, a light-emitting diode with a narrow half-width in its spectral distribution is effectively applicable to such an object. As a result, a high-performance general illumination light source, which can illuminate natural objects in even more natural colors and brilliant-colored artificial objects in much more sharply contrasted brilliant colors, is realized.

It should be noted that if a lamp is expected to just illuminate an object brilliantly, then the Ra index does not have to be increased more than necessarily. Then, such an LED lamp is realized in broader peak wavelength ranges.

Embodiment 3

Hereinafter, an LED lamp according to a third embodiment of the present invention will be described with reference to FIGS. 14A through 18C. The LED lamp 100 of the first embodiment includes two LED bare chips, namely, one blue LED chip 11 and one red LED chip 12. In contrast, the LED lamp of the third embodiment includes just one LED bare chip that has the light-emitting sites of both the blue and red LEDs unlike the lamp 100 of the first embodiment. In the other respects, the lamp of the third embodiment is the same as the counterpart 100 of the first embodiment and the description of those common features will be omitted or simplified herein for the sake of simplicity. The second embodiment of the present invention, contributing to the color reproducibility optimization of the LED lamp 100, is naturally applicable to the LED lamp of the third embodiment.

The lamp of the third embodiment uses only one LED bare chip that produces emissions in two different colors. Thus, compared to the lamp 100 of the first embodiment in which two bare chips are disposed side by side for producing emissions in two colors, the following advantages are attainable by the third embodiment. Specifically, since just one LED bare chip is used, the sites at which the red and blue emissions are produced are very close to each other in the same LED bare chip and can be regarded as substantially the same. As a result, the LED lamp can mix these two colors more effectively. In addition, the red- and blue-light-emitting sites are thermally coupled together more strongly and the temperatures at these two sites are even closer to each other. Accordingly, these sites can be regarded as substantially identical thermally and it is easier to perform feedback control over the effects of heat on the optical output.

Hereinafter, it will be described with reference to FIGS. 14A through 14C how to make a single LED bare chip that produces red and blue emissions.

Figure 14A:
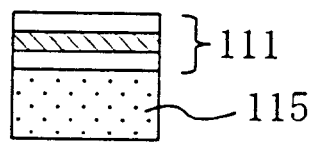
FIGS. 14A through 14C are cross-sectional views illustrating respective process steps for fabricating a single LED bare chip that produces red and blue emissions.

First, as shown in FIG. 14A, a first light-emitting-diode layer (which will be herein abbreviated as an "LED layer") 111, including at least p- and n-type semiconductor layers and an active layer, is formed on a substrate 115 for LEDs.

Figure 14B:
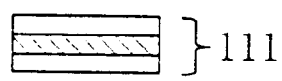

Next, as shown in FIG. 14B, the substrate 115 is once removed from the assembly shown in FIG. 14A to separate the first LED layer 111. To remove the substrate 115, any appropriate technique may be selected depending on the types of the substrate 115 and LED layer 111. For example, the substrate 115 may be gradually removed by a polishing process, lifted off mechanically, etched away or peeled off by placing a thermal stress thereon.

Figure 14C:
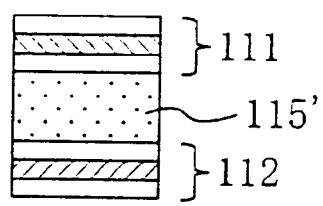

Then, as shown in FIG. 14C, the first LED layer 111 is bonded to the backside of another substrate 115', on the principal surface of which a second LED layer 112 has been formed. In this manner, an LED bare chip for producing emissions in two different colors can be obtained. That is to say, each or one of the blue- and red-light-emitting layers is separated, and then the light-emitting layer(s) is/are bonded to the substrate, thereby obtaining one LED bare chip.

Next, exemplary methods of bonding LED layers to a substrate will be described with reference to FIGS. 15A through 18C. The LED layers may be bonded in various ways, but only typical ones will be exemplified in the following description. It should be noted that the first and second LED layers are supposed to be blue and red LED layers 111 and 112, respectively, for convenience sake. Each pair of LED layers 111 and 112 is surrounded by a phosphor 113.

Figure 15A:
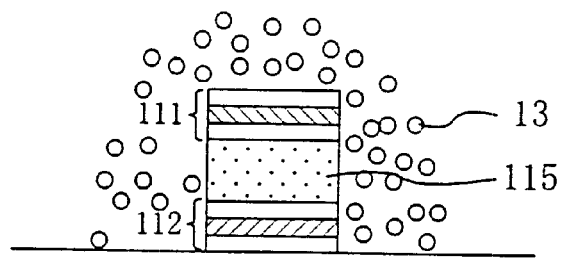
FIGS. 15A through 15C are cross-sectional views illustrating various cross-sectional structures for LED bare chips according to a third embodiment of the present invention.

FIG. 15A illustrates an exemplary double-sided electrode structure including a conductive substrate 115. In this structure, one electrode may be formed on the upper surface of the blue LED layer 111 and another electrode may be formed on the lower surface of the red LED layer 112 with the substrate 115 sandwiched between the two layers 111 and 112.

Figure 15B:
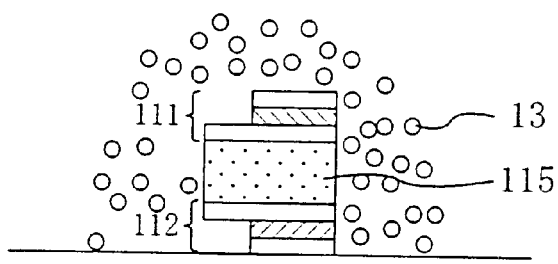

FIG. 15B illustrates an exemplary single-sided electrode structure including a non-conductive substrate 115. In this structure, two electrodes may be formed on the upper surface of the blue LED layer 111 and another two electrodes may be formed on the lower surface of the red LED layer 112 with the substrate 115 sandwiched between the two layers 111 and 112.

Figure 15C:
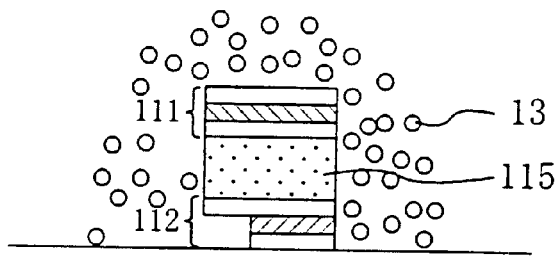

FIG. 15C illustrates a combination of single- and double-sided electrode structures where the substrate 115 is conductive. In this structure, one electrode may be formed on the upper surface of the blue LED layer 111 and two electrodes may be formed on the lower surface of the red LED layer 112 with the substrate 115 sandwiched between the two layers 111 and 112.

Figure 16A:
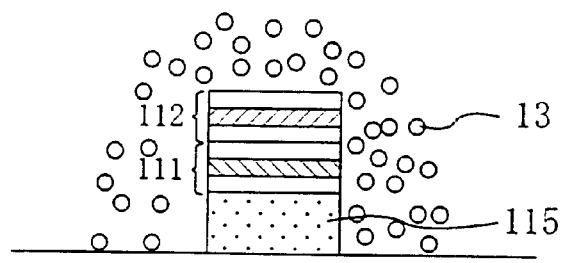
FIGS. 16A through 16C are cross-sectional views illustrating various other cross-sectional structures for LED bare chips according to the third embodiment.

FIG. 16A illustrates an exemplary structure in which the two LED layers 111 and 112 are stacked one upon the other on the upper surface of a conductive substrate 115. In this structure, one electrode may be formed on the upper surface of the red LED layer 112 and another electrode may be formed on the lower surface of the substrate 115.

Figure 16B:
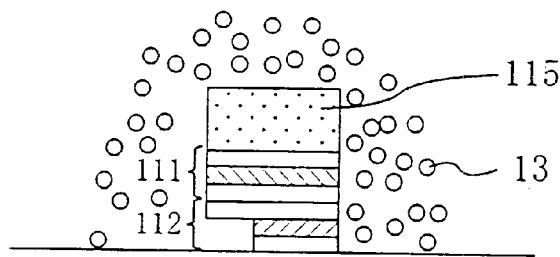

FIG. 16B illustrates an exemplary structure in which an LED layer 111 with double-sided electrodes and another LED layer 112 with single-sided electrodes are stacked one upon the other on the backside of a conductive substrate 115. In this structure, one electrode may be formed on the upper surface of the substrate 115 and two electrodes may be formed on the lower surface of the red LED layer 112.

Figure 16C:
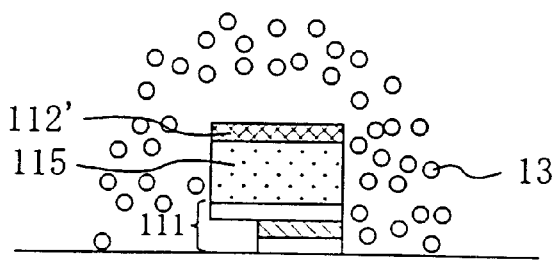

FIG. 16C illustrates an exemplary structure in which a blue LED layer 111 for producing an emission at a short wavelength is formed on the lower surface of a substrate 115 and a red LED active layer 112' is formed on the upper surface of the substrate 115. The red LED active layer 112' produces an emission when photoexcited by the emission produced from the blue LED layer 111. In this structure, two electrodes may be formed on the lower surface of the blue LED layer 111.

The structures shown in FIGS. 15A through 16C are just a part of many imaginable combinations. So the combinations of the LED layers may be naturally modified in various other ways. In addition, the structures shown in FIGS. 15C, 16A, 16B and 16C may also be inverted vertically.

The LED layers 111 and 112 do not have to be stacked one upon the other on one or two sides of the same substrate 115. Alternatively, these layers 111 and 112 may also be placed side by side on one side of the same substrate 115. FIGS. 17A through 18C illustrate typical examples of such structures.

Figure 17A:
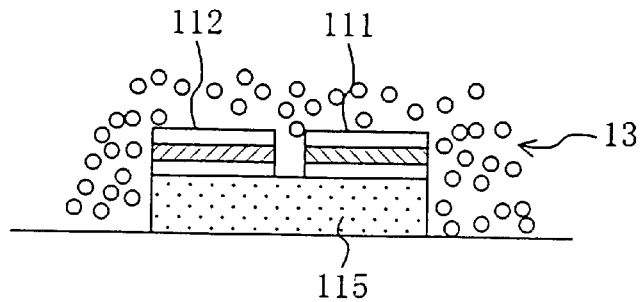
FIGS. 17A through 17C are cross-sectional views illustrating various other cross-sectional structures for LED bare chips according to the third embodiment.

FIG. 17A illustrates a structure in which the blue and red LED layers 111 and 112 are mounted side by side on the upper surface of the same conductive substrate 115. In this structure, one common electrode may be formed on the lower surface of the substrate 115 and two electrodes may be formed on the respective upper surfaces of the LED layers 111 and 112.

Figure 17B:
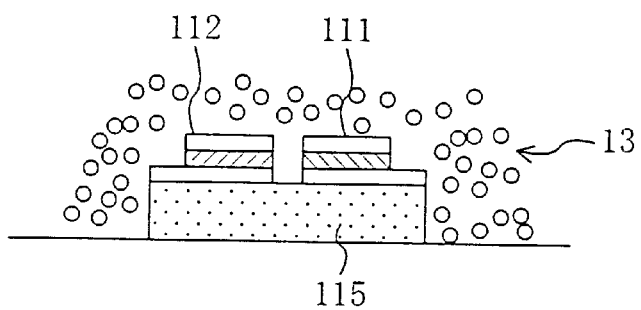

FIG. 17B illustrates a structure in which the blue and red LED layers 111 and 112 are mounted side by side on the upper surface of the same non-conductive substrate 115. In this structure, two electrodes may be formed on the upper surface of each LED layer 111 or 112.

Figure 17C:
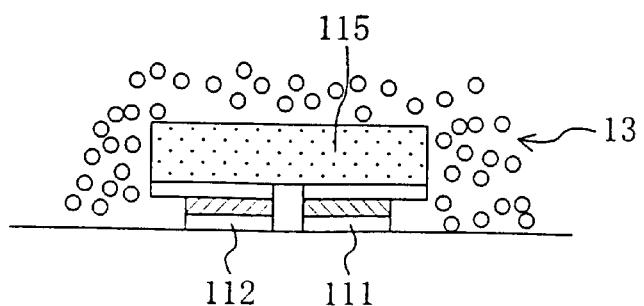

FIG. 17C illustrates a vertically inverted version of the structure shown in FIG. 17B.

Figure 18A:
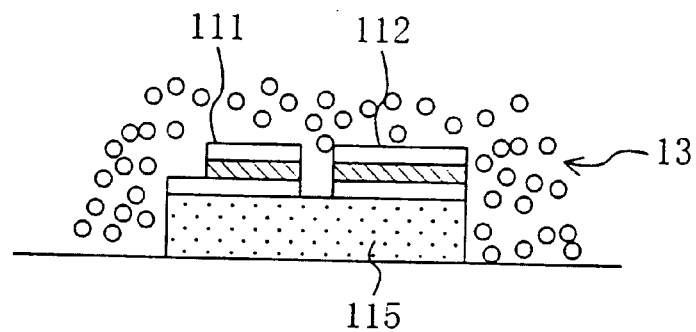
FIGS. 18A through 18C are cross-sectional views illustrating various other cross-sectional structures for LED bare chips according to the third embodiment.

FIG. 18A illustrates a structure in which the blue and red LED layers 111 and 112 are mounted side by side on the upper surface of the same conductive substrate 115. In FIG. 18A, the red LED layer 112 has the same structure as that illustrated in FIG. 17A, in which one common electrode is formed on the lower surface of the substrate 115 and one electrode is formed on the upper surface of the red LED layer 112. The blue LED layer 111 has the same structure as that illustrated in FIG. 17B, in which two electrodes are formed on the upper surface of the blue LED layer 112.

Figure 18B:
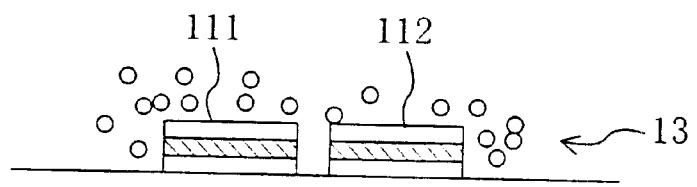

FIG. 18B illustrates a structure in which the two LED layers 111 and 112 are disposed side by side on a pedestal (not shown) directly. This structure needs no substrate 115 and there is no need to perform the bonding process step shown in FIG. 14C for this structure.

Figure 18C:
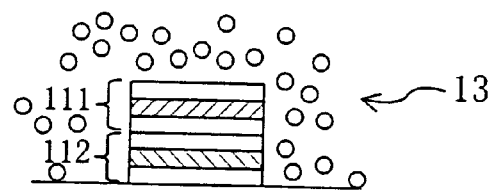

FIG. 18C illustrates a structure in which two LED layers 111 and 112, each including double-sided electrodes, are stacked one upon the other on a pedestal (not shown). This structure needs no substrate 115, either. Also, according to this idea, LED layers with single- and/or double-sided electrodes may be stacked in other combinations. Or even four LED layers may be stacked one upon the other.

The structures shown in FIGS. 17A through 18C are also just a part of many imaginable combinations. So the combinations of the LED layers may be naturally modified in various other ways. In addition, the structures shown in FIGS. 17A, 18A and 18B may also be inverted vertically.

According to the third embodiment, the light-emitting layers 111 and 112 of the blue and red LEDs 11 and 12 are integrated together as one LED chip. Thus, the sites at which the red and blue emissions are produced are very close to each other in the same LED bare chip and can be regarded as substantially the same. As a result, the LED lamp can mix these two colors more effectively. In addition, the red- and blue-light-emitting sites are thermally coupled together more strongly and the temperatures at these two sites are even closer to each other. Accordingly, these sites can be regarded as substantially identical thermally and it is easier to perform feedback control over the effects of heat on the optical output.

Embodiment 4

Figure 19:
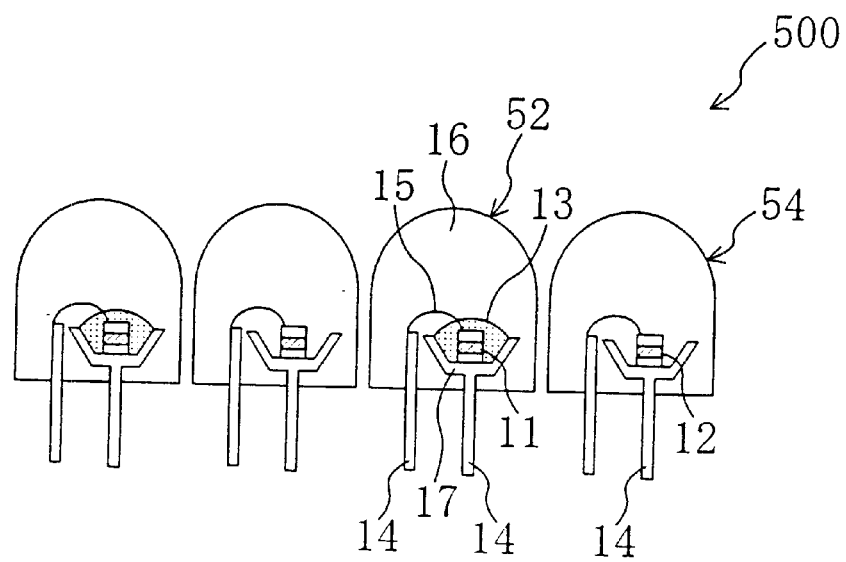
FIG. 19 schematically illustrates an arrangement for an LED lamp array according to a fourth embodiment of the present invention.

Hereinafter, an LED lamp array 500 according to a fourth embodiment of the present invention will be described with reference to FIG. 19. FIG. 19 schematically illustrates an arrangement for the LED lamp array 500. In the LED lamp 100 of the first embodiment, the blue and red LED chips 11 and 12 and phosphor 13 are integrated together within a single envelope. On the other hand, in the LED lamp array 500 of the fourth embodiment, the two LED chips 11 and 12 are included in two separate envelopes to make a cluster. That is to say, the lamp array 500 consists of a number of those clusters. As for the fourth embodiment, only the differences between the first and fourth embodiments will be detailed and the description of the common features will be omitted or simplified.

As shown in FIG. 19, the LED lamp array 500 includes multiple clusters, each being made up of LED white and red light sources 52 and 54. Although only two clusters are illustrated in FIG. 19, a number of clusters with the same structure are actually arranged in columns and rows to make the LED lamp array 500. In other words, the LED white and red light sources 52 and 54 are arranged in matrix. In each cluster, the LED white light source 52 includes the blue LED chip 11 and the yellow emitting phosphor 13 that exhibits a luminescence when photoexcited by the emission of the blue LED chip 11, while the LED red light source 54 includes the red LED chip 12.

In the illustrated embodiment, the LED white light source 52 further includes the bulletlike transparent plastic encapsulant 16 for molding the blue LED chip 11 and the yellow emitting phosphor 13 together. As in the first embodiment, the blue LED chip 11 is mounted on the pedestal 17 of the leadframe 14. The LED red light source 54 further includes the bulletlike transparent plastic encapsulant 16 for molding the red LED chip 12, which is also mounted on the pedestal 17 of the leadframe 14. The LED white and red light sources 52 and 54 may be arranged alternately, for example.

In the LED lamp array 500 of the fourth embodiment, after the LED white and red light sources 52 and 54 have been made of mutually different materials, multiple pairs of light sources 52 and 54 may be assembled together to form a lamp unit. Accordingly, the design processes of the LED light sources of these two types can be optimized separately. It is also possible to pick and assemble together only good LED light source products for a lamp unit, thus increasing the production yield. Furthermore, these light sources can be easily designed in such a manner as to improve the heat dissipation thereof.

Moreover, even though luminous fluxes are separately output from the blue and red LED chips 11 and 12, these LED chips are independent of each other. So the blue and red LED chips 11 and 12 may be assembled together in any arbitrary numbers. That is to say, the number of blue or red LED chips 11 or 12 included in the lamp array 500 may be arbitrarily determined. For that reason, this lamp array 500 can be designed much more flexibly than usual. This is because compared to the first embodiment where multiple LED lamps, each including blue and red LED chips 11 and 12 at a fixed ratio (i.e., one to one), are assembled together, the arrangement of the fourth embodiment can increase the flexibility of the lamp design process.

In this LED lamp array 500, the LED light sources 52 and 54 individually produce emissions in respective colors at spatially discrete positions. Accordingly, compared to the LED lamp 100 of the first embodiment, in which the blue and red LED chips 11 and 12 are integrated together within a single envelope, the lamp array 500 might result in increased color unevenness. To reduce such color unevenness, LED white and red light sources may be arranged as in an alternative LED lamp array 600 including stereoscopic clusters as shown in FIG. 20.

Figure 20:
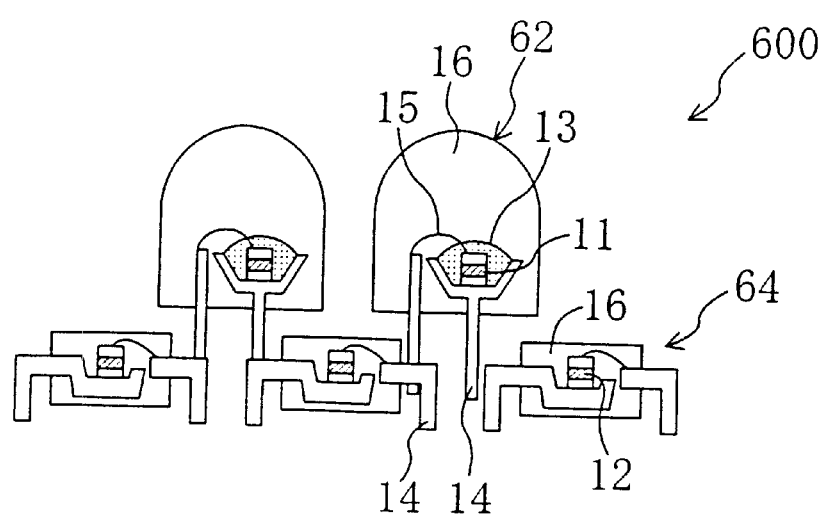
FIG. 20 schematically illustrates an arrangement for another LED lamp array according to the fourth embodiment.

In the example illustrated in FIG. 20, the LED lamp array 600 also includes multiple clusters, each being made up of LED white and red light sources 62 and 64. In each cluster, the LED white light source 62 includes the blue LED chip 11 and the yellow emitting phosphor 13 that exhibits a luminescence when photoexcited by the emission of the blue LED chip 11, while the LED red light source 64 includes the red LED chip 12. In this array 600, the LED white light sources 62 are located at a different level from that of the LED red light sources 64. That is to say, the two types of LED light sources 62 and 64 are arranged stereoscopically at two mutually different levels in this LED lamp array 600. Accordingly, the emissions outgoing from the LED light sources 62 and 64 can be mutually reflected or refracted, thus reducing the color unevenness. This LED lamp array 600 is so constructed as to further improve the color mixing performance by combining the bullet-shaped LED light sources 62 that have a relatively narrow luminous intensity distribution with the box-shaped LED light sources 64 that have a relatively wide luminous intensity distribution.

As already described for the first embodiment, the LED lamp array 500 or 600 may produce light in various colors if the array 500 or 600 includes means for controlling the luminous intensity ratio of the LED white and red light sources 52 and 54 or 62 and 64. Also, the yellow emitting phosphor 13 may be replaced with a green emitting phosphor. In that case, LED blue-green light sources 52 or 62, each including the blue LED chip 11 and a green emitting phosphor that exhibits a luminescence when photoexcited by the emission of the blue LED chip 11, and LED red light sources 54 or 64, each including the red LED chip 12, may be assembled together to form the LED lamp array 500 or 600.

In the foregoing embodiments, the blue LED chip 11, made of any of GaN-based compounds (e.g., GaN, AlInGaN and InGaN), is combined with a yellow emitting phosphor. Alternatively, a ZnSe-based blue LED chip may also be used. In that case, white light may be produced by getting a yellow luminescence, produced from a ZnSe substrate, photoexcited by the emission of the ZnSe-based blue LED chip. That is to say, the ZnSe substrate is used as an alternative phosphor then.

Embodiment 5

Figure 21:
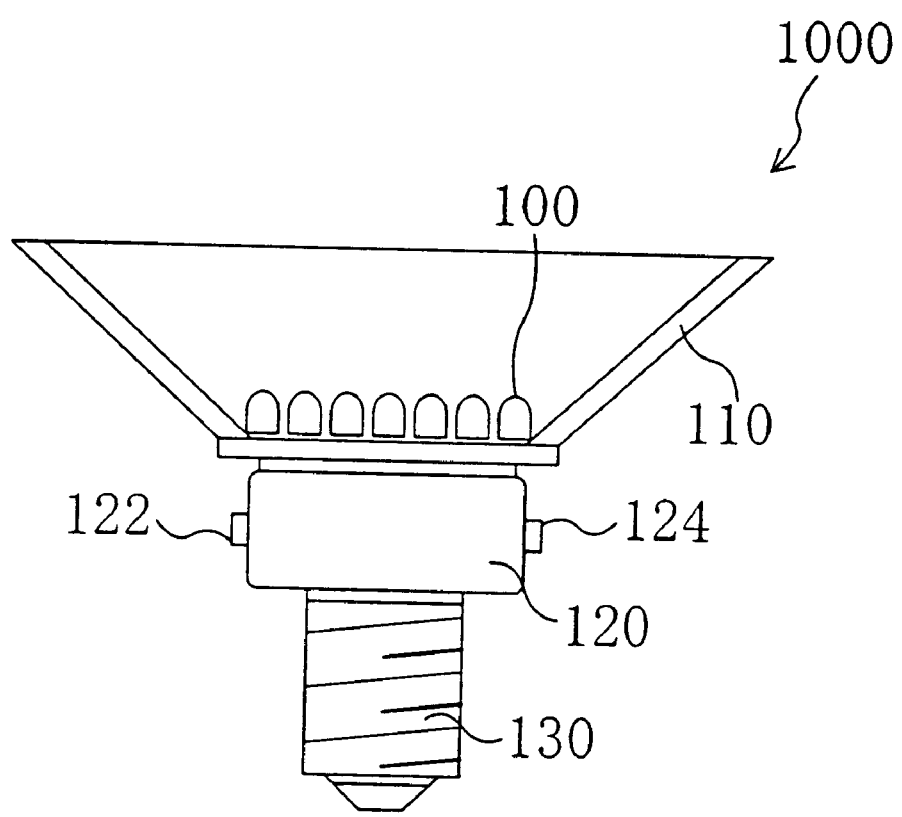
FIG. 21 schematically illustrates a structure for a lamp unit according to a fifth embodiment of the present invention.

The LED lamps of any of the foregoing embodiments may be combined with a power supply to form a lamp unit. In the lamp unit, power is supplied from the power supply to the LED lamps. FIG. 21 schematically illustrates a structure for a lamp unit 1000 according to a fifth embodiment of the present invention.

As shown in FIG. 21, the lamp unit 1000 includes: the LED lamps 100 of the first embodiment; reflector 110 for reflecting off the light produced from the lamps 100; power supply 120 for supplying power to the lamps 100; and base 130 coupled to the power supply 120. A number of, typically 10 to 200, LED lamps 100 can be arranged on the bottom of the reflector 110. Furthermore, if the reflector 110 is thermally coupled to the LED lamps 100, then the reflector 110 can function as a heat sink contributing to dissipating the heat generated from the lamps 100. As a result, the lamps 100 can be used for a longer time. As the reflector 110, either a diffuse reflector (e.g., white light reflector) or a mirror reflector (or reflective mirror) may be used.

The present inventors confirmed that a lamp unit 1000 including about 60 LED lamps 100 had a beam flux (i.e., the amount of luminous flux included within a beam angle) of 60 lm, a lifetime of 10000 hours and a luminous efficacy of about 30 to 50 lm/W. As can be seen, this performance is much better than that of a known lamp unit (with a beam flux of about 60 lm, a lifetime of 2000 hours and a luminous efficacy of about 15 lm/W) in which halogen electric lamps, not an LED lamp, are combined with a dichroic mirror. Also, each LED lamp 100 included in the lamp unit 1000 is a semiconductor device and is very easy to handle because the lamp has nothing to do with the filament disconnection observed in the known electric bulb.

Furthermore, where each LED lamp 100 is so constructed as to produce light in variable colors, the light produced by the lamp unit 1000 can change its color arbitrarily. In that case, the circuit 200 shown in FIG. 6 may be provided for the power supply 120, to which an AC/DC converter may be added, for example. In the example illustrated in FIG. 21, the power supply 120 is equipped with a light color control dial 122 and a brightness control dial 124 so that the color and brightness of the light produced are controllable using these dials 122 and 124.

In the illustrated embodiment, the LED lamps 100 of the first embodiment are used to form a lamp unit. Alternatively, a lamp unit may also be made by combining the LED lamps of the second or third embodiment with the power supply 120 or the LED lamp array 500 or 600 of the fourth embodiment with the power supply 120. Also, the lamp unit 1000 may or may not include the reflector 110 and base 130 depending on its intended application. Furthermore, a unit consisting of around 60 LED lamps 100 may be used as a single light source. Optionally, a plurality of those units may be used at a time.

The inventive LED lamp includes a red LED chip. Accordingly, the LED lamp of the present invention shows good color reproducibility and can produce desired white light at an excellent luminous efficacy. Also, where the lamp further includes means for controlling the luminous intensity of the red LED chip, the lamp can produce light in any arbitrary color by controlling the luminous intensity of the red LED chip.

What is claimed is:

1. A LED lamp comprising:
   a blue LED for producing an emission at a wavelength falling within a blue wavelength range;
   a red LED for producing an emission at a wavelength falling within a red wavelength range; and
   a phosphor, which is photoexcited by the emission of the blue LED to exhibit a luminescence having an emission spectrum in an intermediate wavelength range between the blue and red wavelength ranges.

2. The LED lamp of claim 1, wherein the red LED produces the emission at a peak wavelength of 600 nm or more.

3. The LED lamp of claim 1, wherein the blue LED produces the emission at a peak wavelength of between 450 and 470 nm, and
wherein the red LED produces the emission at a peak wavelength of between 610 and 630 nm, and
wherein the phosphor exhibits the luminescence at a peak wavelength of between 520 and 560 nm.

4. The LED lamp of claim 1, wherein if the LED lamp has a correlated color temperature of 5000 K or more and if color rendering performance of the lamp is appraised using a reconstituted daylight source as a standard source, the blue LED produces the emission at a peak wavelength of between 450 and 460 nm, the red LED produces the emission at a peak wavelength of 600 nm or more and the phosphor exhibits the luminescence at a peak wavelength of between 520 and 560 nm.

5. The LED lamp of claim 1, wherein if the LED damp has a correlated color temperature of less than 5000 K and if the color rendering performance of the lamp is appraised using a black-body source as a standard source, the red LED produces the emission at a peak wavelength of between 615 and 650 nm and the phosphor exhibits the luminescence at a peak wavelength of between 545 and 560 nm.

6. The LED lamp of claim 1, further comprising means for controlling an intensity of the emission produced by the red LED.

7. The LED lamp of claim 6, wherein the control means is a variable resistor.

8. The LED lamp of claim 6, wherein the blue LED produces the emission at a peak wavelength of between 455 and 465 nm, and wherein the red LED produces the emission at a peak wavelength of between 620 and 630 nm, and wherein the phosphor exhibits the luminescence at a peak wavelength of between 540 and 550 nm.

9. The LED lamp of claim 1, wherein the phosphor is a yellow emitting phosphor that exhibits a yellow luminescence when photoexcited by the emission of the blue LED.

10. The LED lamp of claim 9, wherein the yellow emitting phosphor is either a YAG phosphor or a phosphor doped with Mn as a luminescence center.

11. The LED lamp of claim 1, wherein the phosphor is a green emitting phosphor that exhibits a green luminescence when photoexcited by the emission of the blue LED.

12. The LED lamp of claim 11, wherein the green emitting phosphor is either a YAG phosphor or a phosphor doped with at least one element selected from the group consisting of Tb, Ce, Eu and Mn as a luminescence center.

13. The LED lamp of claim 1, wherein the blue and red LEDs and the phosphor are integrated together within a single envelope.

14. The LED lamp of claim 13, wherein a site at which the blue LED produces the emission thereof and a site at which the red LED produces the emission thereof are both located in a single chip.

15. The LED lamp of claim 1, wherein an LED light source, which includes the blue LED and the phosphor, and another LED light source, including the red LED, are separately disposed to make a cluster.

16. A LED lamp unit comprising: at least one LED lamp as recited in claim 1; and a power supply for supplying power to the lamp.

17. The LED lamp of claim 16, further comprising a reflector for reflecting a light produced from the lamp(s).

18. The LED lamp of claim 16, wherein each of the blue and red LEDs are formed on separate chips.

19. The LED lamp of claim 18, wherein the phosphor is arranged on the chip containing the blue LED.

20. The LED lamp of claim 16, wherein each of the blue and red LEDs are formed on the same chip.

21. The LED lamp of claim 1, wherein each of the blue and red LEDs are formed on separate chips.

22. The LED lamp of claim 21, wherein the phosphor is arranged on the chip containing the blue LED.

23. The LED lamp of claim 1, wherein each of the blue and red LEDs are formed on the same chip.

* * * * *

UNITED STATES PATENT AND TRADEMARK OFFICE
CERTIFICATE OF CORRECTION

PATENT NO.    : 6,577,073 B2
DATED         : June 10, 2003
INVENTOR(S)   : Masanori Shimizu et al.

It is certified that error appears in the above-identified patent and that said Letters Patent is hereby corrected as shown below:

<u>Column 25,</u>
Line 21, "LED damp" should be -- LED lamp --

Signed and Sealed this

Thirtieth Day of December, 2003

JAMES E. ROGAN
*Director of the United States Patent and Trademark Office*